(12) United States Patent
Baby et al.

(10) Patent No.: US 12,241,007 B2
(45) Date of Patent: Mar. 4, 2025

(54) BENDABLE ARTICLES INCLUDING ADHESIVE LAYER WITH A DYNAMIC ELASTIC MODULUS

(71) Applicant: CORNING INCORPORATED, Corning, NY (US)

(72) Inventors: Shinu Baby, Painted Post, NY (US); Naigeng Chen, San Jose, CA (US); Edward John Fewkes, Corning, NY (US); Dhananjay Joshi, Painted Post, NY (US); Andrew Peter Kittleson, Honeoye Falls, NY (US); Yousef Kayed Qaroush, Painted Post, NY (US); Ying Zhang, Horseheads, NY (US)

(73) Assignee: CORNING INCORPORATED, Corning, NY (US)

( * ) Notice: Subject to any disclaimer, the term of this patent is extended or adjusted under 35 U.S.C. 154(b) by 576 days.

(21) Appl. No.: 17/637,298

(22) PCT Filed: Aug. 12, 2020

(86) PCT No.: PCT/US2020/045913
§ 371 (c)(1),
(2) Date: Feb. 22, 2022

(87) PCT Pub. No.: WO2021/041035
PCT Pub. Date: Mar. 4, 2021

(65) Prior Publication Data
US 2022/0282130 A1    Sep. 8, 2022

Related U.S. Application Data

(60) Provisional application No. 62/892,768, filed on Aug. 28, 2019.

(51) Int. Cl.
*C09J 9/00* (2006.01)
*B32B 7/12* (2006.01)
(Continued)

(52) U.S. Cl.
CPC ...... *C09J 9/00* (2013.01); *B32B 7/12* (2013.01); *B32B 17/06* (2013.01); *C03C 17/23* (2013.01);
(Continued)

(58) Field of Classification Search
CPC ..... B32B 7/12; B32B 17/06; B32B 2307/412; B32B 2307/51; B32B 2457/20;
(Continued)

(56) References Cited

U.S. PATENT DOCUMENTS 8,312,739 B2   11/2012  Lee et al.
8,561,429 B2   10/2013  Allan et al.
(Continued)

FOREIGN PATENT DOCUMENTS

CN    205238731 U    5/2016
GB      2500749 A   10/2013
(Continued)

OTHER PUBLICATIONS

International Search Report and Written Opinion of the International Searching Authority; PCT/US2020/045913; mailed on Oct. 26, 2020, 10 pages; European Patent Office.
(Continued)

*Primary Examiner* — John D Freeman
(74) *Attorney, Agent, or Firm* — William M. Johnson; Jeffrey A. Schmidt

(57) ABSTRACT

Articles including a substrate, a cover glass layer disposed over a top surface of the substrate, and an adhesive layer having a dynamic elastic modulus disposed between a bottom surface of the cover glass layer and the top surface of the substrate. The cover glass layer may have a thickness
(Continued)

in the range of 1 micron to 200 microns. The dynamic elastic modulus of the adhesive layer may include a first elastic modulus in the range of 10 kPa to 1000 kPa measured at a stress frequency in the range of 0 Hertz to 5 Hertz and a temperature of 23 degrees C., and a second elastic modulus of 500 MPa or more measured at a stress frequency in the range of 10 Hertz to 1000 Hertz and a temperature of 23 degrees C. The adhesive layer may be optically transparent. The articles may be bendable electronic display devices or bendable electronic display device modules.

19 Claims, 14 Drawing Sheets

(51) Int. Cl.
  *B32B 17/06* (2006.01)
  *C03C 17/23* (2006.01)
  *C03C 17/32* (2006.01)
  *G06F 1/16* (2006.01)
  *H10K 77/10* (2023.01)

(52) U.S. Cl.
  CPC ...... *C03C 17/324* (2013.01); *B32B 2307/412* (2013.01); *B32B 2307/51* (2013.01); *B32B 2457/20* (2013.01); *C03C 2217/213* (2013.01); *C03C 2217/214* (2013.01); *C03C 2217/73* (2013.01); *C03C 2217/78* (2013.01); *C09J 2301/30* (2020.08); *G06F 1/1652* (2013.01); *H10K 77/111* (2023.02)

(58) Field of Classification Search
  CPC ....... B32B 27/18; C03C 17/23; C03C 17/324; C03C 2217/213; C03C 2217/214; C03C 2217/73; C03C 2217/78; C09J 9/00; C09J 2301/30; G06F 1/1652; H10K 77/111
  See application file for complete search history.

(56) References Cited

U.S. PATENT DOCUMENTS

| | | |
|---|---|---|
| 9,272,947 B2 | 3/2016 | Baca et al. |
| 9,335,444 B2 | 5/2016 | Hart et al. |
| 2010/0071893 A1 | 3/2010 | Caritey et al. |
| 2010/0246016 A1 | 9/2010 | Carlson et al. |
| 2011/0062849 A1 | 3/2011 | Carlson et al. |
| 2011/0206903 A1 | 8/2011 | Mazumder |
| 2011/0267697 A1 | 11/2011 | Kohli et al. |
| 2011/0267698 A1 | 11/2011 | Guilfoyle et al. |
| 2012/0034435 A1 | 2/2012 | Borrelli et al. |
| 2012/0281292 A1 | 11/2012 | Baca et al. |
| 2013/0130004 A1 | 5/2013 | Milia et al. |
| 2014/0010995 A1 | 1/2014 | Casasanta, III |
| 2015/0110990 A1 | 4/2015 | Chou et al. |
| 2015/0118276 A1 | 4/2015 | Borrelli et al. |
| 2015/0198752 A1 | 7/2015 | Lander et al. |
| 2015/0207102 A1 | 7/2015 | Jeong et al. |
| 2016/0009593 A1 | 1/2016 | Brychell et al. |
| 2016/0130491 A1 | 5/2016 | Park et al. |
| 2019/0006619 A1 | 1/2019 | Hu et al. |
| 2020/0287156 A1 | 9/2020 | Baby et al. |

FOREIGN PATENT DOCUMENTS

| | | | |
|---|---|---|---|
| JP | 10120995 A | * | 5/1998 |
| JP | 2013039833 A | * | 2/2013 |
| WO | 2009/142491 A1 | | 11/2009 |
| WO | 2013/082477 A2 | | 6/2013 |
| WO | 2013/082488 A2 | | 6/2013 |
| WO | 2013/106629 A2 | | 7/2013 |
| WO | 2013/106638 A1 | | 7/2013 |
| WO | 2015/017198 A1 | | 2/2015 |
| WO | 2016/028542 A1 | | 2/2016 |
| WO | 2016/073551 A1 | | 5/2016 |
| WO | 2017/066364 A1 | | 4/2017 |
| WO | 2018/204915 A1 | | 11/2018 |
| WO | 2018/226520 A1 | | 12/2018 |
| WO | 2019/074935 A1 | | 4/2019 |
| WO | WO-2023176456 A1 | * | 9/2023 |

OTHER PUBLICATIONS

John Droske, "Novel Transparent Dilatant Materials Comprised of a Single Chemical Component", WISYS Technologies, 2019, pp. 1-5.

* cited by examiner

BENDABLE ARTICLES INCLUDING ADHESIVE LAYER WITH A DYNAMIC ELASTIC MODULUS

CROSS-REFERENCE TO RELATED APPLICATIONS

This application is a national stage entry of International Patent Application Serial No. PCT/US2020/045913, filed on Aug. 12, 2020, which in turn, claims the benefit of priority under 35 U.S.C. § 119 of U.S. Provisional Application Ser. No. 62/892,768 filed on Aug. 28, 2019, the contents of each of which are is relied upon and incorporated herein by reference in their entireties.

BACKGROUND

Field

The present disclosure relates to bendable articles including an adhesive layer with a dynamic elastic modulus. In particular, the present disclosure relates to bendable articles including a cover glass layer bonded to a substrate via an adhesive layer with a dynamic elastic modulus.

Background

A cover substrate for a display of an electronic device protects a display screen and provides an optically transparent surface through which a user can view the display screen. Recent advancements in electronic devices (e.g., handheld and wearable devices) are trending towards lighter devices with improved bendability and/or flexibility and reliability. The weight of different components of these devices, including protective components, for example cover substrates, have been reduced to create lighter devices.

Also, consumer electronic industries have been focusing on turning wearable and/or flexible concepts into consumer products for years. Recently, thanks to continuous development and improvement of plastic films, plastic-based cover substrates for devices have demonstrated some success in the market. However, the intrinsic drawbacks of using plastic cover substrates remain, for example low moisture and/or oxidation resistibility and low surface hardness. These drawbacks can lead to device failure during use. Also, the use of a plastic substrate for its flexibility may, in some situations, increase weight, reduce optical transparency, reduce scratch resistance, reduce puncture resistance, and/or reduce thermal durability for a cover substrate.

Therefore, a continuing need exists for innovations in cover substrates for consumer products, for example cover substrates for protecting display screens, and in particular, flexible and/or bendable display screens.

BRIEF SUMMARY

The present disclosure is directed to dynamic adhesive layers for articles including a cover glass layer bonded to a substrate. The dynamic adhesive layers provide desired impact resistance and facilitate energy dissipation during an impact event while maintaining bendability of the articles. Adhesive layers disclosed have a dynamic elastic modulus that allows the adhesive layer to behave appropriately when bonding a cover glass layer to a substrate in a bendable article. In particular, the dynamic modulus is large enough during high frequency stress events, such as an impact event, to provide desired impact resistance. But, during low frequency stress events, such as a bending event, the dynamic modulus is low enough to provide desired flexibility at low bend forces.

According to a first aspect of the disclosure, an article is described. The article includes a substrate; a cover glass layer disposed over a top surface of the substrate, the cover glass layer having a thickness in the range of 1 micron to 200 microns; and an adhesive layer disposed between a bottom surface of the cover glass layer and the top surface of the substrate, the adhesive layer having a dynamic elastic modulus including a first elastic modulus in the range of 10 kPa to 1000 kPa measured at a stress frequency in the range of 0 Hertz to 5 Hertz and a temperature of 23 degrees C. and a second elastic modulus of 500 MPa or more measured at a stress frequency in the range of 10 Hertz to 1000 Hertz and a temperature of 23 degrees C.

A second aspect of the disclosure includes the first aspect, where the adhesive layer has a second elastic modulus is in the range of 500 MPa to 10 GPa. A third aspect of the disclosure includes the first aspect, where the adhesive layer has a second elastic modulus is in the range of 1 GPa to 10 GPa.

A fourth aspect of the disclosure includes any of the preceding aspects, where the adhesive layer has the first elastic modulus is in the range of 10 kPa to 1000 kPa across the stress frequency range of 0 Hertz to 5 Hertz.

A fifth aspect of the disclosure includes any of the preceding aspects, where the adhesive layer is optically transparent.

A sixth aspect of the disclosure includes any of the preceding aspects, where the cover glass layer has a thickness in the range of 1 micron to 125 microns.

A seventh aspect of the disclosure includes any of aspects one through five, where the cover glass layer has a thickness in the range of 1 micron to 125 microns.

An eighth aspect of the disclosure includes any of the preceding aspects, where the adhesive layer has a thickness in the range of 25 microns to 75 microns.

A ninth aspect of the disclosure includes any of the preceding aspects, where the cover glass layer is directly bonded to the top surface of the substrate with the adhesive layer.

A tenth aspect of the disclosure incudes any of the preceding aspects, where the adhesive layer includes a viscoelastic material.

An eleventh aspect of the disclosure includes any of the preceding aspects, where the adhesive layer includes a shear thickening material. In a twelfth aspect, the shear thickening material of aspect eleven may include colloidal nanoparticles dispersed in a solution. In a thirteenth aspect, the colloidal nanoparticles of aspect twelve may have an average particle size of 200 nanometers or less. In a fourteenth aspect, the colloidal nanoparticles of aspect twelve or aspect thirteen may be composed of a material having a first refractive index and the solution may have a second refractive index, where the difference between the first refractive index and the second refractive index is 0.02 or less.

A twelfth aspect of the disclosure includes any of the preceding aspects, wherein the shear thickening material comprises colloidal nanoparticles dispersed in a solution.

A thirteenth aspect of the disclosure includes the twelfth aspect, wherein an average particle size of the colloidal nanoparticles is 200 nanometers or less.

A fourteenth aspect of the disclosure includes the twelfth aspect or thirteenth aspect, wherein the colloidal nanoparticles comprise a first refractive index and the solution comprises a second refractive index, and a difference between the first refractive index and the second refractive index is 0.02 or less.

A fifteenth aspect of the disclosure includes any of the preceding aspects, where the substrate includes an electronic display having a display surface defining at least a portion of the top surface of the substrate.

A sixteenth aspect of the disclosure includes any of the preceding aspects, further including a coating layer disposed on a top surface of the cover glass layer. In a seventeenth aspect, the coating layer of aspect sixteen incudes at least one of an anti-reflection coating layer, an anti-glare coating layer, an anti-fingerprint coating layer, an anti-microbial coating layer, or an easy-to-clean coating layer.

An seventeenth aspect of the disclosure includes aspect 16, wherein the coating layer comprises at least one of an anti-reflection coating layer, an anti-glare coating layer, an anti-fingerprint coating layer, an anti-microbial coating layer, or an easy-to-clean coating layer.

An eighteenth aspect of the disclosure includes any of the preceding aspects, wherein at least one of a top surface or the bottom surface of the cover glass layer comprises a compressive stress, and a concentration of metal oxide through a thickness of the cover glass layer is different at two or more points.

A ninetieth aspect of the disclosure includes any of the preceding aspects, where the article is a consumer electronic product and the substrate includes an electronic display, the consumer electronic product including a housing having a front surface, a back surface and side surfaces and electrical components at least partially within the housing, the electrical components including a controller, a memory, and the electronic display, the electronic display at or adjacent the front surface of the housing, where the cover glass layer forms at least a portion of the housing.

According to a twentieth aspect of the disclosure, an electronic display component is described. The electronic display component includes an electronic display having a display surface; a cover glass layer disposed over the display surface, the cover glass layer having a thickness in the range of 1 micron to 200 microns; and an optically transparent adhesive layer disposed between a bottom surface of the cover glass layer and the display surface of the electronic display, the adhesive layer having a dynamic elastic modulus including: a first elastic modulus in the range of 10 kPa to 1000 kPa measured at a stress frequency in the range of 0 Hertz to 5 Hertz and a temperature of 23 degrees C. and a second elastic modulus of 500 MPa or more measured at a stress frequency in the range of 10 Hertz to 1000 Hertz and a temperature of 23 degrees C.

A twenty-first aspect of the disclosure includes the twentieth aspect, where the optically transparent adhesive layer includes a viscoelastic material.

A twenty-second aspect of the disclosure includes aspect twenty or aspect twenty-one, where the optically transparent adhesive layer comprises a shear thickening material.

A twenty-third aspect of the disclosure includes any of aspects twenty through twenty-two where the optically transparent adhesive layer comprises a thickness in the range of 25 microns to 75 microns.

According to a twentieth-fourth aspect of the disclosure, a method of making an electronic display component is described. The method incudes disposing an optically transparent adhesive layer between a top, user-facing surface of an electronic display and a bottom surface of a glass layer, where the glass layer has a top, user-facing surface opposite the bottom surface and a thickness in the range of 1 micron to 200 microns and where the adhesive layer has a dynamic elastic modulus including: a first elastic modulus in the range of 10 kPa to 1000 kPa measured at a stress frequency in the range of 0 Hertz to 5 Hertz and a temperature of 23 degrees C. and a second elastic modulus of 500 MPa or more measured at a stress frequency in the range of 10 Hertz to 1000 Hertz and a temperature of 23 degrees C.

BRIEF DESCRIPTION OF THE DRAWINGS

The accompanying figures, which are incorporated herein, form part of the specification and illustrate embodiments of the present disclosure. Together with the description, the figures further serve to explain the principles of and to enable a person skilled in the relevant art(s) to make and use the disclosed embodiments. These figures are intended to be illustrative, not limiting. Although the disclosure is generally described in the context of these embodiments, it should be understood that it is not intended to limit the scope of the disclosure to these particular embodiments. In the drawings, like reference numbers indicate identical or functionally similar elements.

DETAILED DESCRIPTION

Figure 1:
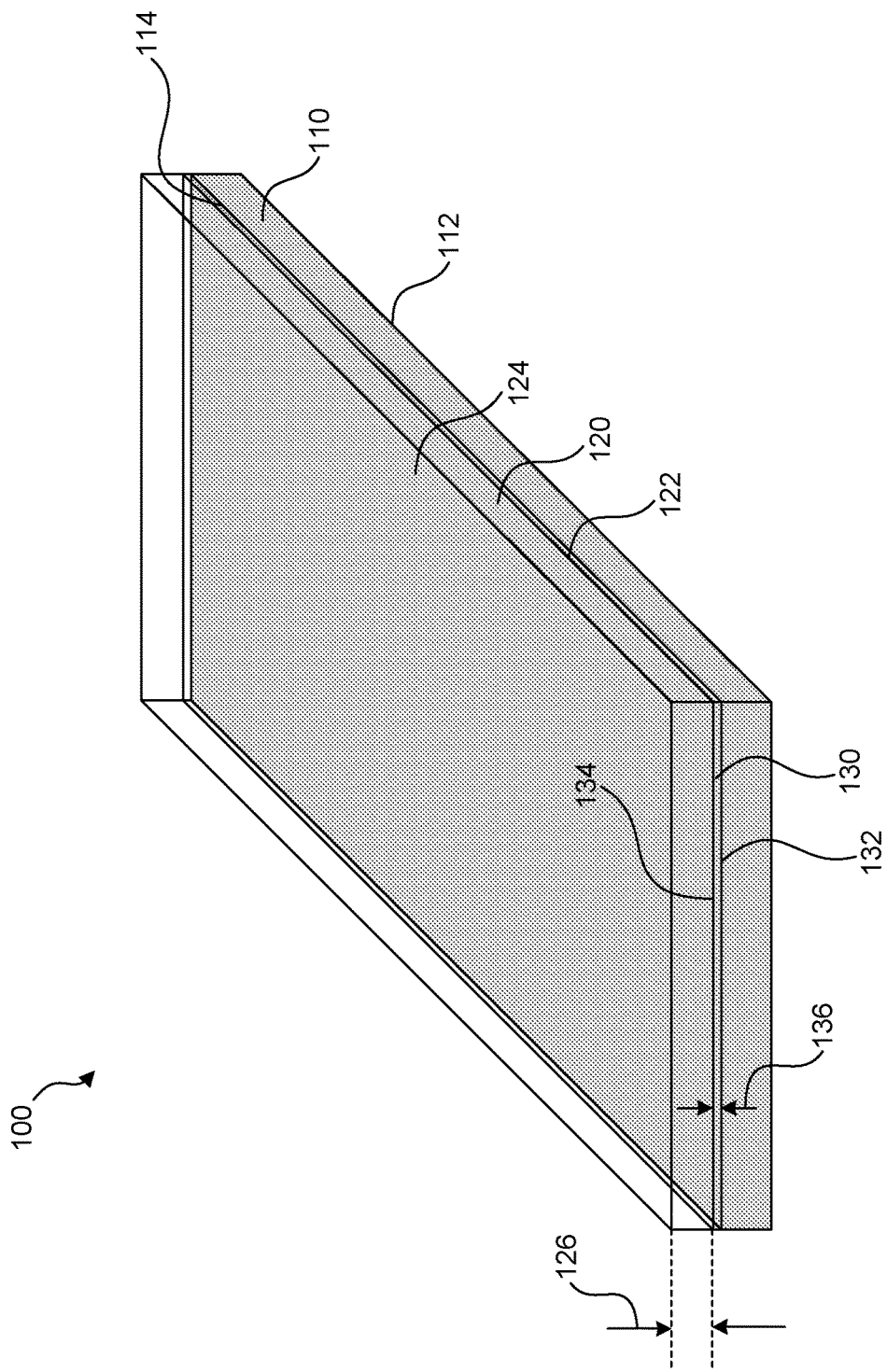
FIG. 1 illustrates an article according to some embodiments.

The following examples are illustrative, but not limiting, of the present disclosure. Other suitable modifications and adaptations of the variety of conditions and parameters normally encountered in the field, and which would be apparent to those skilled in the art, are within the spirit and scope of the disclosure.

Cover substrates for consumer products, for example cover glass, may serve to, among other things, reduce undesired reflections, prevent formation of mechanical defects in the glass (e.g., scratches or cracks), and/or provide an easy to clean transparent surface. The articles disclosed herein may be incorporated into another article, for example, an article with a display (or display articles) (e.g., consumer electronic products, including mobile phones, tablets, computers, navigation systems, wearable devices (e.g., watches) and the like), architectural articles, transportation articles (e.g., automotive, trains, aircraft, sea craft, etc.), appliance articles, or any article that may benefit from some transparency, scratch-resistance, abrasion resistance, or a combination thereof. An exemplary article incorporating any of the glass articles disclosed herein is a consumer electronic device including a housing having front, back, and side surfaces; electrical components that are at least partially inside or entirely within the housing and including at least a controller, a memory, and a display at or adjacent to the front surface of the housing; and a cover substrate at or over the front surface of the housing such that it is over the display. In some embodiments, at least a portion of the housing comprises a glass article as disclosed herein.

Cover substrates, for example cover glasses, also serve to protect sensitive components of a consumer product from mechanical damage (e.g., puncture and impact forces). For consumer products including a flexible, foldable, and/or sharply curved portion (e.g., a flexible, foldable, and/or sharply curved display screen), a cover substrate for protecting the display screen should preserve the flexibility, foldability, and/or curvature of the screen while also protecting the screen. Moreover, the cover substrate should resist mechanical damage, for example scratches and fracturing, so that a user can enjoy an unobstructed view of the display screen.

Thick monolithic glass substrates may provide adequate mechanical properties, but these substrates can be bulky and incapable of folding to tight radii in order to be utilized in foldable, flexible, or sharply curved consumer products. And highly flexible cover substrates, such a plastic substrate, may be unable to provide adequate puncture resistance, scratch resistance, and/or fracture resistance desirable for consumer products.

The present application discloses bendable and/or flexible articles that take advantage of the characteristics of thin glass substrates and that also have suitable mechanical properties to resist failure during use. Impact resistance and the ability to bend without failure are desirable design parameters for foldable and/or bendable devices.

With respect to impact resistance, an article can occasionally experience extreme impact loading events. These events can include, for example, an external object impact (e.g., a pen impact) and an article drop. A foldable and/or bendable article should be able to withstand common impact events like these without failure.

With respect to bending, an article should not fail under the bending conditions for which the article was designed and during its normal and intended use. In some cases, these bending conditions may include bending of the article to very small bending radii. However, at the same time, the bend force to bend the article to the intended bending radii should also be small enough such that an average person can bend the article without difficulty. Relatively low bending forces to fold or otherwise bend an article can be particularly beneficial to a user when the article is employed in applications that include manual bending (e.g., a foldable, wallet-like flexible display device).

The present application discloses adhesive layers that improve impact resistance of an article without negatively affecting the bendability of the article (for example, the ability of an article to bend to a certain bend radius without failure) or significantly increasing the bend force to bend the article to a desired bend radius. More particularly, adhesive layers according to embodiments of the present application have a dynamic elastic modulus that provides desired bendability and impact resistances. At low strain rates (stress frequencies) associated with a bending event the elastic modulus of the adhesive layer is low enough to facilitate bending at low bend forces without device or cover glass failure. At high strain rates (stress frequencies) associated with an impact even (e.g., pen impact or device drop), the elastic modulus of the adhesive layer is high enough to prevent device or cover glass failure.

As disclosed herein, the bendability of a foldable article can be preserved and high impact resistance for the foldable article can be achieved using an adhesive layer with an appropriate dynamic elastic modulus. This dynamic elastic modulus allows the adhesive layers to provide desired bendability and impact resistance for articles discussed herein. During a bending event, the stress loading speed is in a relatively low frequency range. So, if the elastic modulus of an adhesive layer is kept relatively low and constant across the low frequency range, the bendability of an article will not be significantly influenced by the adhesive layer. In contrast to a bending event, during an impact event, the stress loading speed is relatively high (e.g., on the order of one tenth of a second or less). So, if the elastic modulus of an adhesive layer is sufficiently high during a high stress loading speed event, the adhesive layer can improve impact resistance. This in turn improves the mechanical reliability of an article.

A "dynamic elastic modulus" means that the elastic modulus of that material is dependent on the rate of strain (stress frequency) applied to the material. Unless stated otherwise, a "dynamic elastic modulus" is measured using a Dynamic Mechanical Analysis (DMA) according to ASTM standards D4065, D4440, and D5279. ASTM 4065 establishes the practice for gathering and reporting the dynamic mechanical data of ASTM 4440 and ASTM 5279. Based on the combined results and procedures of these three standards, the viscoelastic behavior and/or dilatant behavior of a material with respect to frequency of stress application and temperature of the material can be characterized. If an elastic modulus is defined as having a value "in" or "within" a range of Hertz values, only one whole number Hertz value within the range is required to result in the elastic modulus value. If an elastic modulus is defined as having a value "across" a range of Hertz values, the value remains true for each whole number Hertz value within the range. A Hertz frequency value is the reciprocal of the time over which a load or force (e.g., impact) is applied to a material. For example, an impact event can apply an impact force for a fraction of second. As another example, a bending event can apply a bending force for 1-2 seconds.

Unless stated otherwise, elastic moduli are measured at room temperature, which for purposes of the present application is equal to 23 degrees C. Exemplary materials having a "dynamic elastic modulus" include viscoelastic materials and shear thickening materials. Elastic moduli discussed herein may also be referred to as storage moduli.

Among other features and benefits, adhesive layers disclosed herein can be incorporated into an article (e.g., a bendable electronic device or bendable electronic device module) to provide desired mechanical reliability at small bend radii (e.g., in static tension and fatigue) as well as high puncture resistance for the article. Configurations of these articles are also characterized by relatively low bending forces to fold or otherwise bend these articles. With regard to mechanical reliability, the articles are configured to avoid cohesive failures in their cover glass layers and delamination-related failures at interfaces between the various components of the articles (e.g., adhesive-cover glass layer interfaces). The small bend radii and puncture resistance capabilities can be beneficial when the bendable articles are used in, for example, a foldable electronic device display, such as one where one portion of the display is folded over on top of another portion of the display. For example, the articles may be used as one or more of: a cover on the user-facing portion of a foldable electronic display device, a location in which puncture resistance is particularly beneficial, a substrate module, disposed internally within the device itself, on which electronic components are disposed; or elsewhere in a foldable electronic display device. Articles disclosed herein may also be used in a device not having a display, but one in which a cover glass layer is used for its beneficial properties and is folded or otherwise bent, in a similar manner as in a foldable display, to a tight bend radius.

As demonstrated herein, using an adhesive material with a sufficiently high modulus in a high frequency range reduces maximum principle stresses on cover glass surfaces during an impact event. Hence, articles including such an adhesive material bonding a cover glass to a substrate are capable of withstanding relatively high pen drop heights and are capable of demonstrating improved drop performance. This concept is proved herein using dynamic finite element methods that compare simulation results of different adhesive materials. By utilizing an appropriate adhesive material for bonding a cover glass to a substrate, an article can have the following characteristics: good mechanical reliability, high impact resistance, thin stack design, light weight, low manufacturing costs, ease of bending (folding), low force to bend the article, and/or a less complex hinge portion at which the article is designed to bend.

FIG. 1 illustrates an article 100 according to some embodiments. Article 100 includes a substrate 110 and a cover glass layer 120 bonded to the substrate 110 with an adhesive layer 130. Cover glass layer 120 may be disposed over all or a portion of a top surface 114 of substrate 110. Cover glass layer 120 may cover all or a portion of substrate 110. Cover glass layer 120 may cover all or a portion of top surface 114 of substrate 110. In some embodiments, cover glass layer 120 may cover the entirety of top surface 114. In such embodiments, cover glass layer 120 may cover top surface 114 of substrate 110 between all opposing edges of top surface 114. In some embodiments, cover glass layer 120 may be directly bonded to top surface 114 of substrate 110 with adhesive layer 130.

In some embodiments, substrate 110 may be an electronic display or electronic display component including an electronic display. In such embodiments, all or a portion of top surface 114 of substrate 110 may be a display surface of the electronic display or electronic display component. In other words, the display surface may define all or a portion of top surface 114 of substrate 110. Exemplary electronic displays include a light emitting diode (LED) display or an organic light emitting diode (OLED) display. In some embodiments, substrate 110 may be a non-electronic display device. For example, substrate 110 may be a display device that displays static or printed indicia. In some embodiments, substrate 110 may be or may include a touch sensor, such as a capacitive touch sensor, a polarizer, or a battery.

Figure 2:
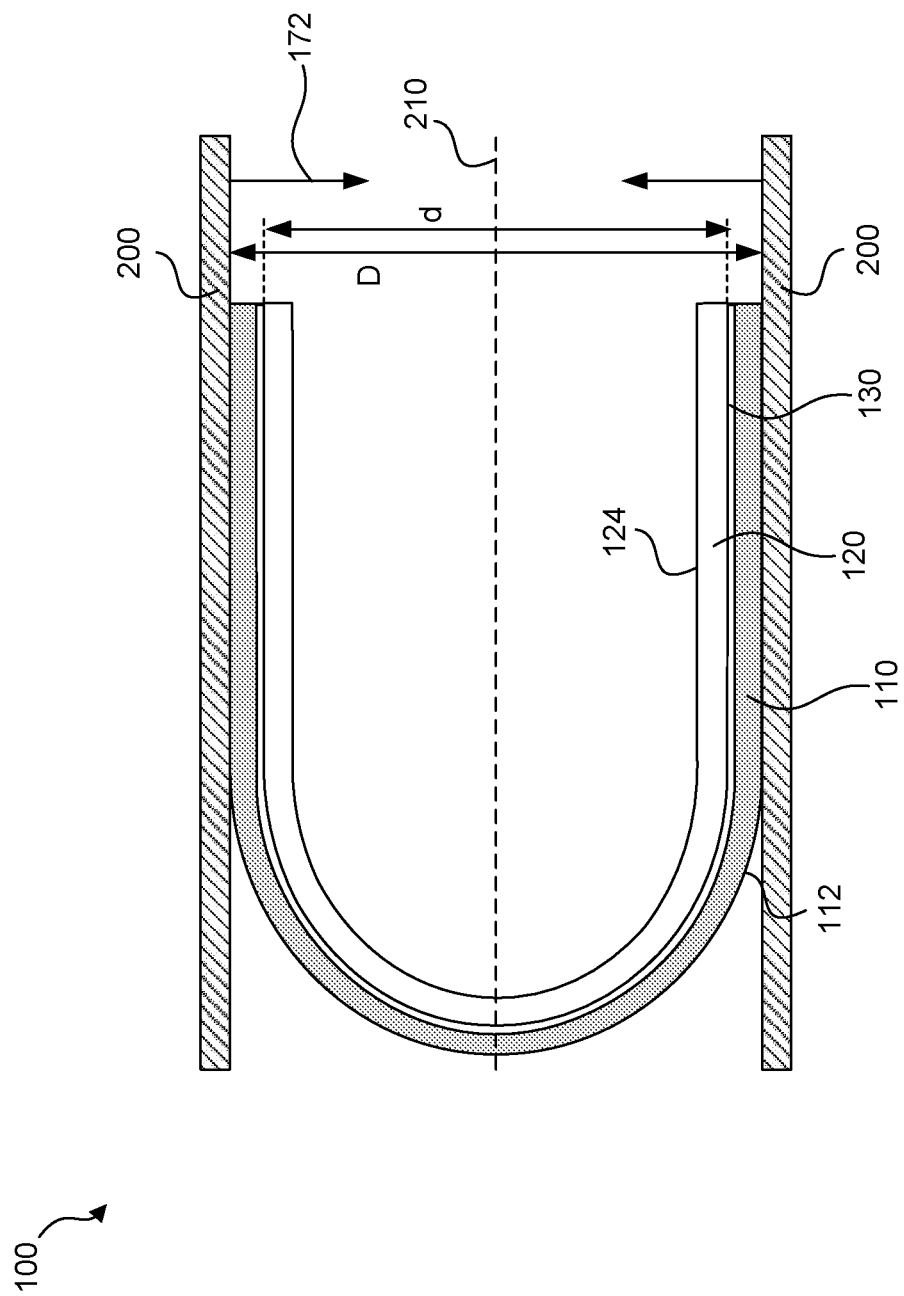
FIG. 2 illustrates a cross-sectional view of the article of FIG. 1 upon bending of the article.

In some embodiments, substrate 110, for example an electronic display or electronic display component, may be a flexible substrate. As used herein, a flexible cover glass layer 120, article 100, or substrate 110 is a layer, article, or substrate characterized by the ability of the cover glass layer 1200, article 100, or substrate 110 to avoid failure during a two-point bend test when held between two plates at a plate distance of 20 millimeters (mm) or less for at least 240 hours at about 85° C. and about 85% relative humidity. A plate distance is the linear distance in a straight line between opposing exterior surfaces of a substrate 110, article 100, or cover glass layer 120 during a two-point bend test. For example, "D" represents the plate distance for substrate 110 (and article 100) in FIG. 2 and "d" represents the plate distance for cover glass layer 120. In FIG. 2, "D" is "d" plus two times the thickness 136 of adhesive layer 130 and two times the thickness of substrate 110. In some embodiments, substrate 110, article 100, and/or cover glass layer 120 may be characterized by the ability of substrate 110, article 100, and/or cover glass layer 120 to avoid failure when held between two plates at a plate distance of 20 mm or less, 15 mm or less, 10 mm or less, 9 mm or less, 8 mm or less, 7 mm or less, 6 mm or less, 5 mm or less, 4 mm or less, 3 mm or less, 2 mm or less, or 1.5 mm or less. In some embodiments, cover glass layer 120 may have a thickness 126, measured from bottom surface 122 to top surface 124, in the range of 1 micron (µm, micrometers) to 200 microns, including subranges therebetween. For example, cover glass layer 120 may have a thickness 126 of 1 micron, 5 microns, 10 microns, 15 microns, 20 microns, 25 microns, 30 microns, 40 microns, 50 microns, 60 microns, 70 microns, 75 microns, 80 microns, 90 microns, 100 microns, 110 microns, 120 microns, 125 microns, 130 microns, 140 microns, 150 microns, 160 microns, 170 microns, 175 microns, 180 microns, 190 microns, or 200 microns, or within a range having any two of these values as end points. In some embodiments, cover glass layer 120 may have a thickness 126 in the range of 1 micron to 125 microns. In some embodiments, cover glass layer 120 may have a thickness 126 in the range of 1 micron to 75 microns.

In some embodiments, cover glass layer 120 may be an ultra-thin glass layer. As used herein, the term "ultra-thin glass layer" means a glass layer having a thickness 126 in the range of 0.1 microns to 75 microns. In some embodiments, cover glass layer 120 may be a strengthened glass layer, such as a glass layer that has been subject to an ion-exchange process or a thermal tempering process. For a cover glass layer 120 subject to an ion-exchange process, the cover glass layer 120 includes a compressive stress at top surface 124 and/or bottom surface 122 and a concentration of metal oxide that is different at two or more points through thickness 126 of cover glass layer 120. In some embodiments, cover glass layer 120 may be a non-strengthened glass layer, such as a glass layer that has not been subject to an ion-exchange process or a thermal tempering process.

In some embodiments, cover glass layer 120 may be an optically transparent glass layer. As used herein, "optically transparent" means an average transmittance of 70% or more in the wavelength range of 400 nm to 700 nm through a 1.0 mm thick piece of a material. In some embodiments, an optically transparent material may have an average transmittance of 75% or more, 80% or more, 85% or more, or 90% or more in the wavelength range of 400 nm to 700 nm through a 1.0 mm thick piece of the material. The average transmittance in the wavelength range of 400 nm to 700 nm is calculated by measuring the transmittance of all whole number wavelengths from 400 nm to 700 nm and averaging the measurements.

In some embodiments, cover glass layer 120 may include an alkali-containing aluminosilicate glass material. Other suitable materials for cover glass layer 120 include amorphous materials, such as but not limited to, soda lime glass, alkali-containing borosilicate glass, and alkali aluminoborosilicate glass. In some variants, the glass material may be free of lithia.

In some embodiments, cover glass layer 120 may be a redrawn glass layer. In some embodiments, cover glass layer 120 may be a glass layer formed using a process devoid of a chemical thinning process (for example, cover glass layer 120 may be a non-chemically thinned glass layer, or may be a non-thinned glass layer). As used herein, the term "redrawn cover glass layer" means a layer of glass material that was drawn to its final thickness in a redrawing process. For example, in a redrawing process, a glass block may be heated to a desired drawing temperature and stretched by draw rollers to reduce its thickness to the final thickness of a cover glass layer. After redrawing to the final thickness, no additional process steps are utilized to significantly change the thickness of the cover glass layer. Grinding or polishing may be used to shape the edges of a redrawn cover glass layer, but such grinding or polishing is not considered as changing the thickness of the layer. As used herein, the term "chemically thinned cover glass layer" means a layer of glass material that was subjected to one or more chemical etching processes to reduce its thickness to the final desired thickness of the glass layer. A chemically thinned (also called etched) glass layer will have different properties than a redrawn glass layer due to the etching process(es) used to reduce its thickness. For example, surfaces of a redrawn glass layer may be significantly smoother than surfaces of a chemically thinned glass layer. The surface roughness for redrawn glass layer can be as small as about 0.1 nm (nanometers)-0.2 nm while the minimum surface roughness of a chemically thinned glass layer is about 2 nm-3 nm.

In some embodiments, cover glass layer 120 may be a single monolithic layer. As used herein, "single monolithic layer" means a single integrally formed layer having a generally consistent composition across its volume. A layer that is made by layering one or more layers or materials, or by mechanically attaching different layers, is not considered a single monolithic layer. In some embodiments, cover glass layer 120 may be a multi-layer glass.

In some embodiments, top surface 124 of cover glass layer 120 may be a topmost exterior, user-facing surface of article 100. As used herein, the terms "top surface" or "topmost surface" and "bottom surface" or "bottommost surface" reference the top and bottom surface of a layer, component, or article as is would be oriented during its normal and intended use with the top surface being the user-facing surface. For example, when incorporated into a hand-held consumer electronic product having an electronic display, the "top surface" of an article or layer refers to the top surface of that article or layer as it would be oriented when held by a user viewing the electronic display through the article or layer.

In some embodiments, top surface 124 of cover glass layer 120 may be coated with one or more coating layers (e.g., a coating layer 150) to provide desired characteristics. Such coating layers include, but are not limited to, polymeric hard-coating layers, anti-reflection coating layers, anti-glare coating layers, anti-fingerprint coating layers, anti-microbial and/or anti-viral coating layers, and easy-to-clean coating layers. In some embodiments, article 100 may be devoid of a coating layer (e.g., a coating layer 150) disposed over or bonded to top surface 124 of cover glass layer 120. In some embodiments, article 100 may be devoid of a polymeric hard-coating layer disposed over or bonded to top surface 124 of cover glass layer 120. A polymeric hard-coating layer, such as the optically transparent polymeric (OTP) hard-coat layers described herein, is a layer with significant hardness configured to improve puncture and/or fracture resistance of an article. A cover glass layer 120 coated with one or more coating layers, or not coated with any coating layers, may be referred to a "cover substrate."

Adhesive layer 130 is disposed between bottom surface 122 of cover glass layer 120 and top surface 114 of substrate 110 and bonds cover glass layer 120 to substrate 110. In some embodiments, adhesive layer 130 may be disposed on top surface 114 of substrate 110. In such embodiments, a bottom surface 132 of adhesive layer 130 is in direct contact with top surface 114 of substrate 110. In some embodiments, adhesive layer 130 may be disposed on bottom surface 122 of cover glass layer 120. In such embodiments, a top surface 134 of adhesive layer 130 is in direct contact with bottom surface 122 of cover glass layer 120.

As used herein, "disposed on" means that a first layer and/or component is in direct contact with a second layer and/or component. A first layer and/or component "disposed on" a second layer and/or component may be deposited, formed, placed, or otherwise applied directly onto the second layer and/or component. In other words, if a first layer and/or component is disposed on a second layer and/or component, there are no layers disposed between the first layer and/or component and the second layer and/or component. A first layer and/or component described as "bonded to" a second layer and/or component means that the layers and/or components are bonded to each other, either by direct contact and/or bonding between the two layers and/or components or via an adhesive layer. If a first layer and/or component is described as "disposed over" a second layer and/or component, other layers may or may not be present between the first layer and/or component and the second layer and/or component.

Adhesive layer 130 may have a thickness 136, measured from bottom surface 132 to a top surface 134 of adhesive layer 130, in the range of 5 microns to 100 microns, including subranges therebetween. For example, thickness 136 of adhesive layer 130 may be 5 microns, 10 microns, 15 microns, 20 microns, 25 microns, 30 microns, 35 microns, 40 microns, 45 microns, 50 microns, 55 microns, 60 microns, 65 microns, 70 microns, 75 microns, 80 microns, 85 microns, 90 microns, 95 microns, 100 microns, or within a range having any two of these values as endpoints. In some embodiments, thickness 136 may be in the range of 25 microns to 75 microns. In some embodiments, adhesive layer 130 may be an optically transparent adhesive layer.

Adhesive layer 130 has a dynamic elastic modulus having a first elastic modulus measured in a first stress frequency range at room temperature and a second elastic modulus measured in a second stress frequency range at room temperature, where the first elastic modulus is less than the second elastic modulus and the first stress frequency range is lower than and does not overlap the second stress frequency range. For example, the first stress frequency range may be 0 Hertz to 5 Hertz and the second stress frequency range may be 10 Hertz to 1000 Hertz. In other words, adhesive layer 130 comprises a material with an elastic modulus that increases as the rate of stress loaded on the material increases.

Figure 3:
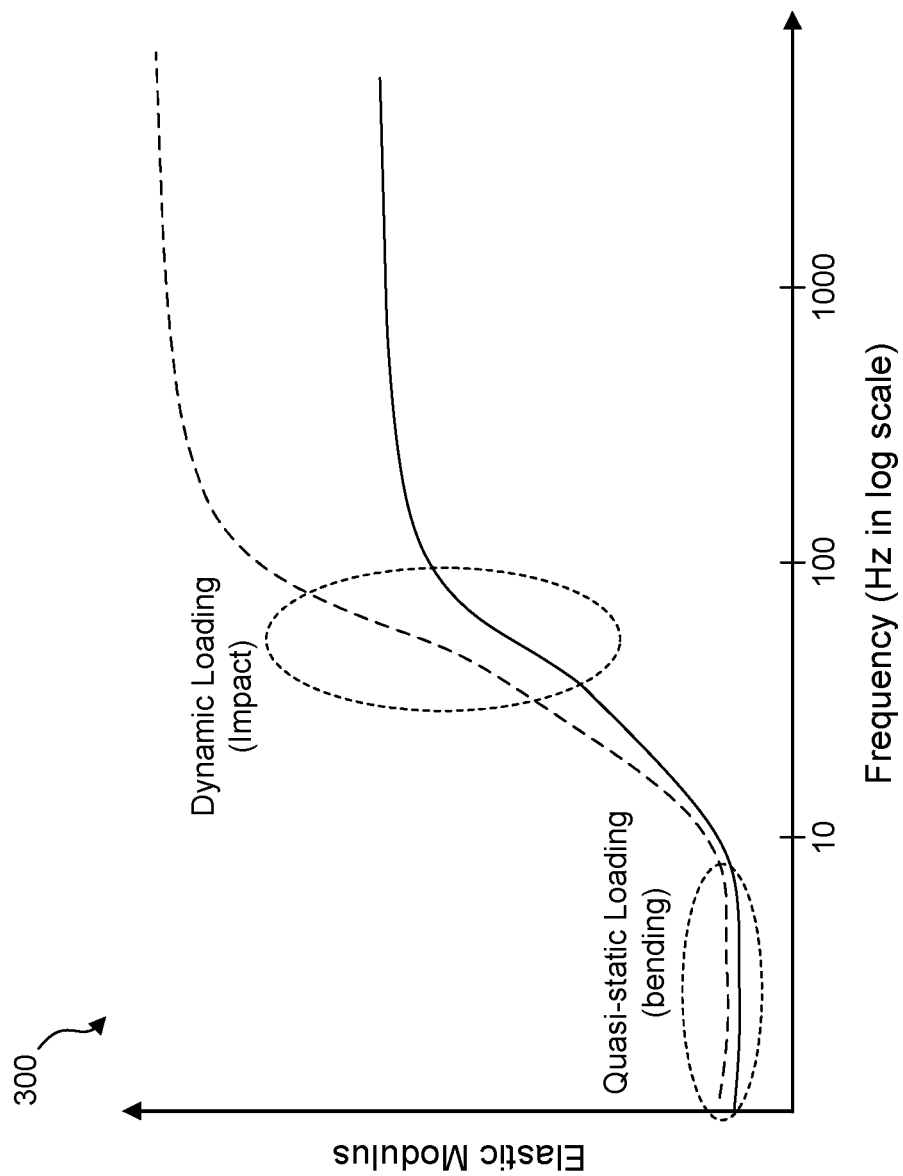
FIG. 3 is a graph of elastic modulus as a function of stress frequency.

As illustrated in graph 300 of FIG. 3, some adhesive materials may exhibit some limited shear thickening behavior. The limited shear thickening behavior of some materials is illustrated with a solid line in graph 300. However, such a limited shear thickening behavior may not provide adequate impact resistance for article 100. Adhesive layer materials disclosed herein have a high frequency modulus one to three orders of magnitude higher for high stress frequency loading. These materials are illustrated in graph 300 with a dashed line. The dynamic modulus of adhesive layer materials disclosed herein can be engineered through controlling crosslink types, crosslink density, and/or crystalline phase compositions of the materials to produce a material having characteristics represented by the dashed line in FIG. 3—low elastic modulus at low stress frequency and suitably high elastic modulus at high stress frequency.

Figure 14:
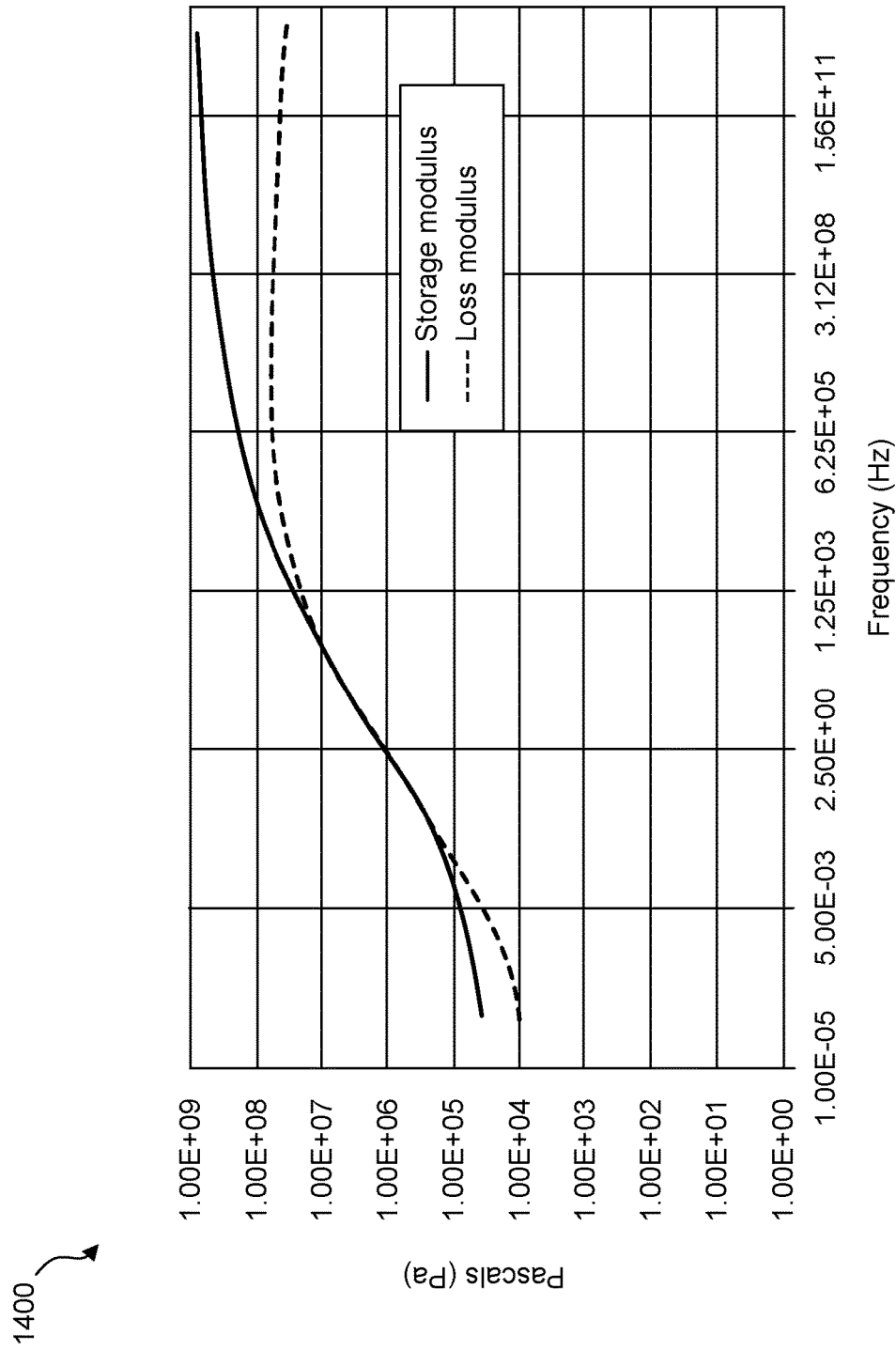
FIG. 14 is a graph of elastic moduli as a function of stress frequency for an adhesive material.

Graph 1400 in FIG. 14 illustrates the limited shear thickening behavior of an exemplary commercially available optically clear adhesive material (3M™ Optically Clear Adhesive 8215). Graph 1400 shows the results of a dynamic mechanical analysis of this adhesive performed at zero degrees C. The analysis was performed at zero degrees C. because the glass transition temperature of this material is just below zero degrees C. To obtain a stable dynamic mechanical analysis response, it can be helpful to perform the analysis near the glass transition temperature of a material. As shown in graph 1400, the elastic modulus (storage modulus) for this material achieves a maximum value of about 25 MPa within the stress frequency range of 10 Hertz to 1000 Hertz.

In some embodiments, the first elastic modulus of adhesive layer 130 may be in the range of 10 kPa (kilopascals) to 1000 kPa, including subranges therebetween, measured at a stress frequency in the range of 0 Hertz to 5 Hertz and a temperature of 23 degrees C. For example, the first elastic modulus of adhesive layer 130 may be 10 kPa, 50 kPa, 100 kPa, 200 kPa, 300 kPa, 400 kPa, 500 kPa, 600 kPa, 700 kPa, 800 kPa, 900 kPa, or 1000 kPa, or within a range having any two of these values as endpoints. In some embodiments, first elastic modulus may be in the range of 10 kPa to 1000 kPa, including subranges therebetween, measured across the stress frequency range of 0 Hertz to 5 Hertz and at a temperature of 23 degrees C. For example, the first elastic modulus of adhesive layer 130 across the stress frequency range of 0 Hertz to 5 Hertz may be within a range having any of the following two values as endpoints: 10 kPa, 50 kPa, 100 kPa, 200 kPa, 300 kPa, 400 kPa, 500 kPa, 600 kPa, 700 kPa, 800 kPa, 900 kPa, or 1000 kPa.

Such a first elastic modulus within or across any of these ranges facilitates bending of article 100 at low bend forces and without failure. As used herein, the term "failure" under a bending force refers to breakage, destruction, delamination, crack propagation, permanent deformation, or other mechanisms that leave article 100, a layer of article 100 (for example cover glass layer 120), and/or a component of article 100 (for example substrate 110) unsuitable for its intended purpose.

In some embodiments, first elastic modulus of adhesive layer 130 may facilitate bending of article 100 to at a plate distance "D" mm using a bend force 172 of 150 Newtons (N) or less as article 100 is bent inward (as shown in FIG. 2) or outward (opposite direction as that shown in FIG. 2). In some embodiments, the bending force is less than or equal to 150 N, 140 N, 130 N, 120 N, 110 N, 100 N, 90 N, 80 N, 70 N, 60 N, 50 N, 40 N, 30 N, 20 N, 10 N, or 5 N, or within a range having any two of these values as endpoints, upon bending of article 100 to a plate distance (D) of 40 mm to 1.5 mm), for example, 20 mm, 19.75 mm, 19.5 mm, 19.25 mm, 19 mm, 18.5 mm, 17.5 mm, 17 mm, 16.5 mm, 16 mm, 15.5 mm, 15 mm, 14.5 mm, 14 mm, 13.5 mm, and 13 mm, 12.5 mm, 12 mm, 11.5 mm, 11 mm, 10.5 mm, 10 mm, 9.5 mm, 9 mm, 8.5 mm, 7.5 mm, 7 mm, 6.5 mm, 6 mm, 5.5 mm, 5 mm, 4.5 mm, 4 mm, 3.5 mm, 3.25 mm, 3 mm, 2 mm, or 1.5 mm.

Referring to FIG. 2, a bend force 172 is measured using a two-point bend test apparatus where two plates 200 are pressed against article 100 during a bending test with a constant force, bend force 172. Fixtures associated with the test apparatus ensure that article 100 is bent symmetrically relative to line 210 as the bend force 172 is applied to article 100 via plates 200. Plates 200 are moved together in unison until a particular plate distance is achieved.

In some embodiments, the second elastic modulus of adhesive layer 130 may be 500 MPa (megapascals) or more when measured at a stress frequency in the range of 10 Hertz to 1000 Hertz and a temperature of 23 degrees C. In some embodiments, the second elastic modulus of adhesive layer 130 may be in the range of 500 MPa to 10 GPa (gigapascals), including subranges therebetween, when measured at a stress frequency in the range of 10 Hertz to 1000 Hertz and a temperature of 23 degrees C. For example, the second elastic modulus of adhesive layer 130 may be 500 MPa, 600 MPa, 700 MPa, 750 MPa, 800 MPa, 900 MPa, 1 GPa, 2 GPa, 2.5 GPa, 3 GPa, 4 GPa, 5 GPa, 6 GPa, 7.5 GPa, 8 GPa, 9 GPa, or 10 GPa, or a within a range having any two of these values as endpoints. In some embodiments, the second elastic modulus of adhesive layer 130 may be in the range of 1 GPa to 10 GPa. In some embodiments, the second elastic modulus of adhesive layer 130 may greater than 10 GPa when measured at a stress frequency in the range of 10 Hertz to 1000 Hertz and a temperature of 23 degrees C. For example, second elastic modulus may be within a range having 11 GPa, 12 GPa, 13 GPa, 14 GPa, or 15 GPa as the upper limit. A second elastic modulus having such a value, or value range, helps prevent failure of article 100 during an impact event, such as a pen drop event or another drop event.

Suitable materials for adhesive layer 130 include, but are not limited to viscoelastic materials or shear thickening materials. In some embodiments, adhesive layer 130 may include, consist essentially of, or consist of a viscoelastic material. In some embodiments, adhesive layer 130 may include, consist essentially of, or consist of a shear thickening material.

One suitable type of shearing thickening adhesive material is a particle-based material comprising a high loading of colloidal particles dispersed in a suitable solution. The colloidal particles may be, but are not limited to, silica particles, poly(methyl methacrylate) (PMMA) particles, polystyrene (PS) particles, and their derivatives with different surface modifications. As used herein, a "colloidal" particle means a particle dispersed and insoluble in a solution in which it is mixed. In some embodiments, to ensure optical transparency, the average particle size of the colloidal particles may be 200 nm (nanometers) or less and/or the refractive index difference between the nanoparticles and solvent is less than or equal to 0.02 (e.g., in the range of 0.001 to 0.02). In other words, the colloidal nanoparticles may be composed of a material having a first refractive index, the solution may have a second refractive index, and the difference between the first refractive index and the second refractive index is 0.02 or less. The solution may be, but is not limited to, water, ethylene glycol (EG), and polyethylene glycol (PEG).

Such shear thickening fluids layers may be disposed on or over cover glass layer 120 using any of the following approaches. (1) By direct encapsulation of the shear thickening fluid between cover glass layer 120 and a capping layer (e.g., optional capping layer 160 shown in FIG. 12). The capping layer may be a thin polymer layer or a thin glass layer. In such embodiments, the capping layer may be bonded to top surface 114 of substrate 110. (2) Impregnating a shear thickening fluid into a continuous porous polymer network structure that adheres to bottom surface 122 of cover glass layer 120. (3) Impregnating a shear thickening fluid into a closed porous polymer network structure that adheres to bottom surface 122 of cover glass layer 120. For approaches #2 and #3, exemplary porous polymer network materials include, but are not limited to, polyurethane and siloxane. In some embodiments, the porous network may be a random or pre-defined ordered structure fabricated by a top-down or bottom-up fabrication method, such as a photolithography method or a self-assembly method.

Suitable viscoelastic shear thickening (dilatant) adhesive materials, include but are not limited to, polymer blends including one or more shear thickening fluids and composite materials made by mixing a reconfigurable supramolecular polymer with nanoparticles that possess dilatant behavior. Viscoelastic material properties of these materials can be engineered through controlling the crosslink types, the crosslink density, and/or the crystalline phase compositions of the materials.

Exemplary polymer blends may be formed by blending one or more shear thickening fluids, one or more rubber precursors, and a catalyzing agent. In some embodiments, a viscoelastic shear thickening adhesive may be formed by polymer blending with one or more shear thickening fluids to form multiple phase microstructures as described in U.S. Pat. Pub. No. 2010/0071893 A1, which is hereby incorporated in its entirety by reference thereto.

Exemplary supramolecular polymers include, but are not limited to, reversible hydrogen bond-based supramolecular polymers, metal-hydroxide modified siloxanes, such as boric-acid modified polydimethyl siloxane (PDMS), and reversible metal ligand-based supramolecular polymers as described in WO 2009/142491 A1, which is hereby incorporated in its entirety by reference thereto. In some embodiments, to ensure the optical transparency, the average size of the nanoparticles may be 200 nm or less and/or the refractive index difference between the nanoparticles and supramolecular polymer is less than or equal to 0.02 (e.g., in the range of 0.001 to 0.02). In other words, the nanoparticles may be composed of a material having a first refractive index, the supramolecular polymer may have a second refractive index, and the difference between the first refractive index and the second refractive index is 0.02 or less.

Dynamic finite element modeling was used to demonstrate the ability of adhesive layers with dynamic elastic moduli described herein to provide desired bendability and impact resistance for articles. The dynamic finite element modeling modeled the nonlinear material behavior of exemplary adhesive layers to evaluate stress imparted on an article 100 during a pen drop event. By modeling the stresses imparted by a Pen Drop Test (as described below and in connection with FIG. 5), the degree of stresses imparted on a cover glass layer 120 and a substrate 110 can be analyzed to evaluate the ability of an adhesive layer to provide desired impact resistance for a foldable device.

As described and referred to herein, the modeled "Pen Drop Test" models the stresses imparted on surfaces of an article resulting from an impact load (for example, from a pen dropping at a certain height). For purposes of the model, a bottom surface of a cover glass layer is modeled as being bonded to a layer of polyethylene terephthalate (PET), acting as the substrate for the article, with an adhesive layer. The modeled PET layer in the Pen Drop Test is meant to simulate a flexible electronic display device (e.g., an OLED device). In the models, a modeled pen is dropped on a top surface of an article (top surface 434 in FIGS. 4A and 4B). A cover glass layer can fail on the top surface or a bottom surface (bottom surface 432 in FIGS. 4A and 4B) of the layer due to an impact force, so stresses on both of these surfaces were modeled to study the effects different adhesive materials.

Figure 4B:
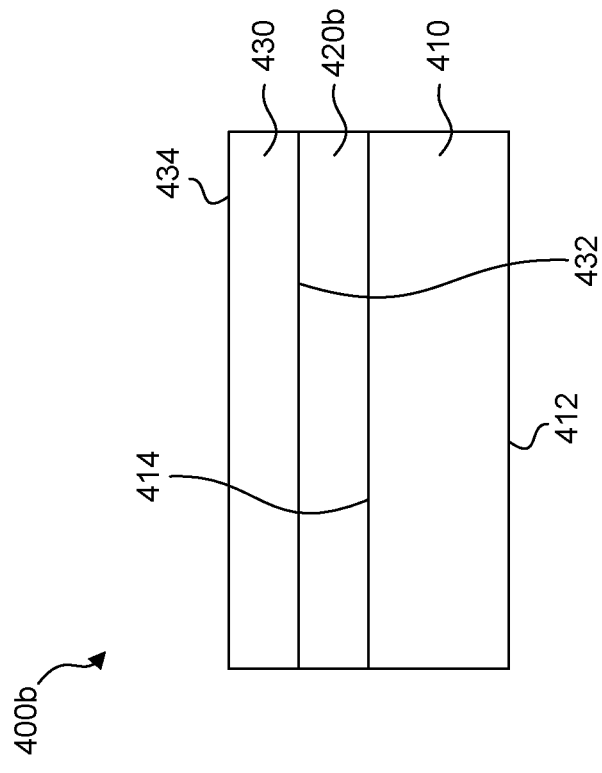
FIGS. 4A and 4B illustrate modeled test samples.
Figure 4A:
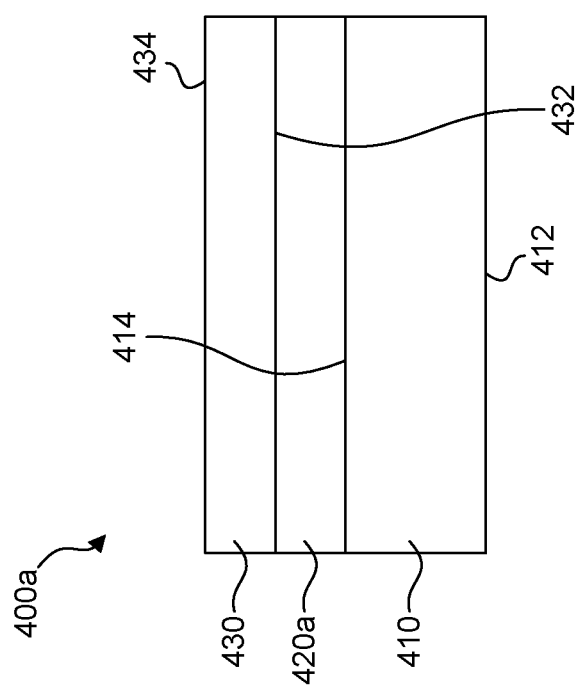

FIGS. 4A and 4B illustrate the two test samples modeled. Both modeled test sample 400a and modeled test sample 400b include a 50-micron thick cover glass layer 430 bonded to a 100-micron thick PET substrate 410 with a 50-micron thick adhesive layer 420a/420b. The modeled cover glass layer 430 had a density of 2,450 kg/m$^3$ (kilograms per meter cubed), a modulus of elasticity of 71 GPa, and a Poisson's ratio of 0.22. The modeled PET substrate 410 had a density of 1,038 kg/m$^3$, a modulus of elasticity of 5.4 GPa, and a Poisson's ratio of 0.38. The modeled adhesive layers 420a and 420b had the same elastic modulus in a low frequency range but different elastic moduli in a high frequency range. In particular, the solid line in FIG. 3 is representative of the elastic modulus characteristics of modeled adhesive layer 420a and the dashed line in FIG. 3 is representative of the elastic modulus characteristics of modeled adhesive layer 420b. Since the modeled pen drop impact models an impact over a short period of time (for example, the time over which the modeled pen strikes top surface 434 of samples 400a and 400b), the Pen Drop Test evaluates a high stress frequency range (e.g., a stress frequency in the range of 10 Hertz to 1000 Hertz). Modeled adhesive layer 420a for test sample 400a had an elastic modulus of 100 MPa for purposes of the pen drop impact. Modeled adhesive layer 420b for test sample 400b had an elastic modulus of 10 GPa for purposes of the pen drop impact.

Figure 5:
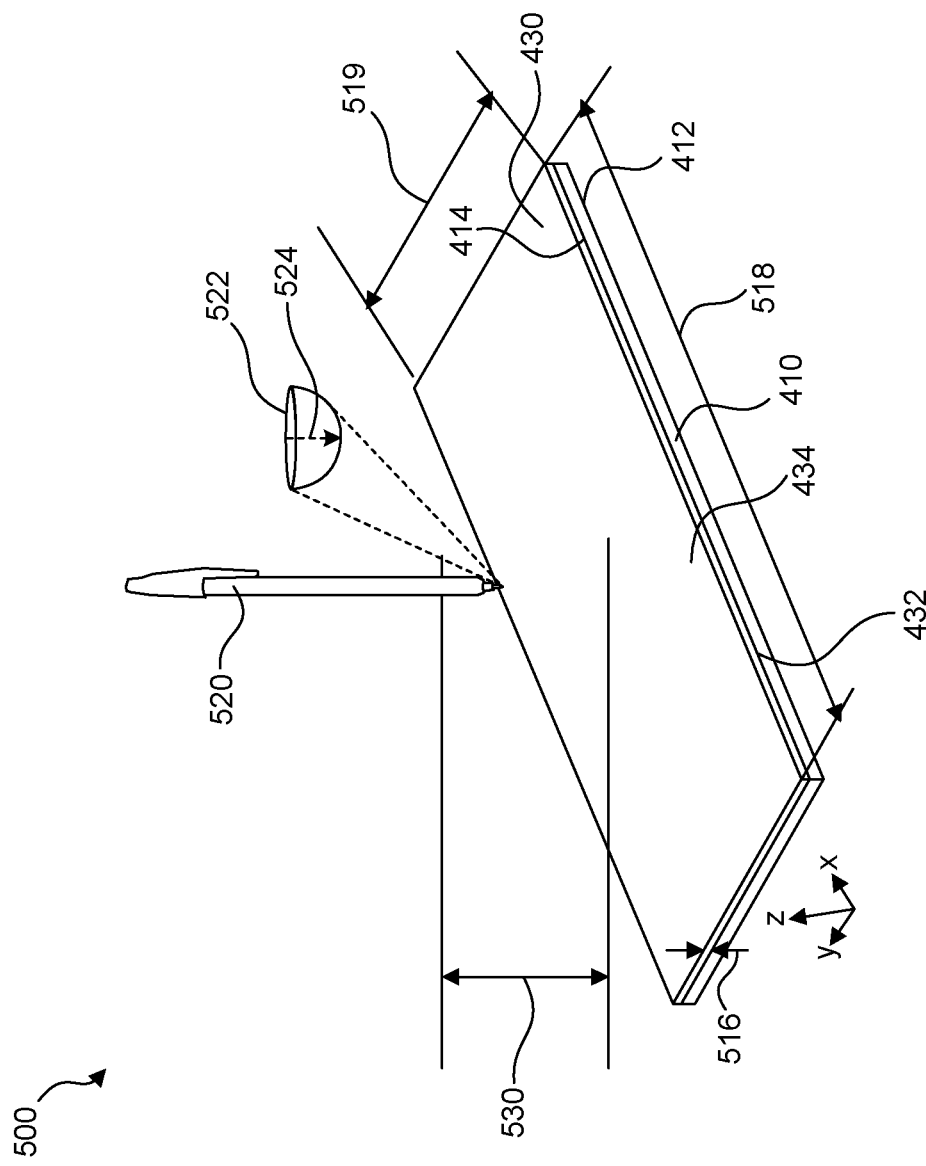
FIG. 5 illustrates a finite element model to simulate pen drop tests according to some embodiments.

FIG. 5 illustrates a finite element model 500 used to analyze impact stresses. Modeled cover glass layer 430 and substrate 410 of test samples 400a and 400b are in model 500. For the model, top surface 434 of modeled cover glass layer 430 is loaded with puncture force and bottom surface 432 of modeled cover glass layers 430 is the surface bonded to top surface 414 of substrate 410 with adhesive layer 420a and 420b. In model 500, the X-direction is measured on top surface 434 along the length 518 of modeled cover glass layer 430, the Y-direction is measured on top surface 434 along the width 519 of modeled cover glass layer 430, and the Z-direction is measured through the thickness 516 of modeled cover glass layer 430 from bottom surface 432 to top surface 434. Pen drop height 530 is measured in the Z direction. For model 500, a pen 520 was modeled to impart a puncture load on top surface 434 of modeled cover glass layer 430. Pen 520 was modeled to replicate a BIC® Easy Glide Pen, Fine, having a tungsten carbide ball point tip 522 of 0.7 mm (0.68 mm) diameter (radius 524 of 0.34 mm), and a weight of 5.73 grams (which includes the weight of a BIC® Easy Glide Pen's cap). Bottom surface 412 of substrate 410 is modeled as being statically supported on a flat, hard surface.

Figure 6:
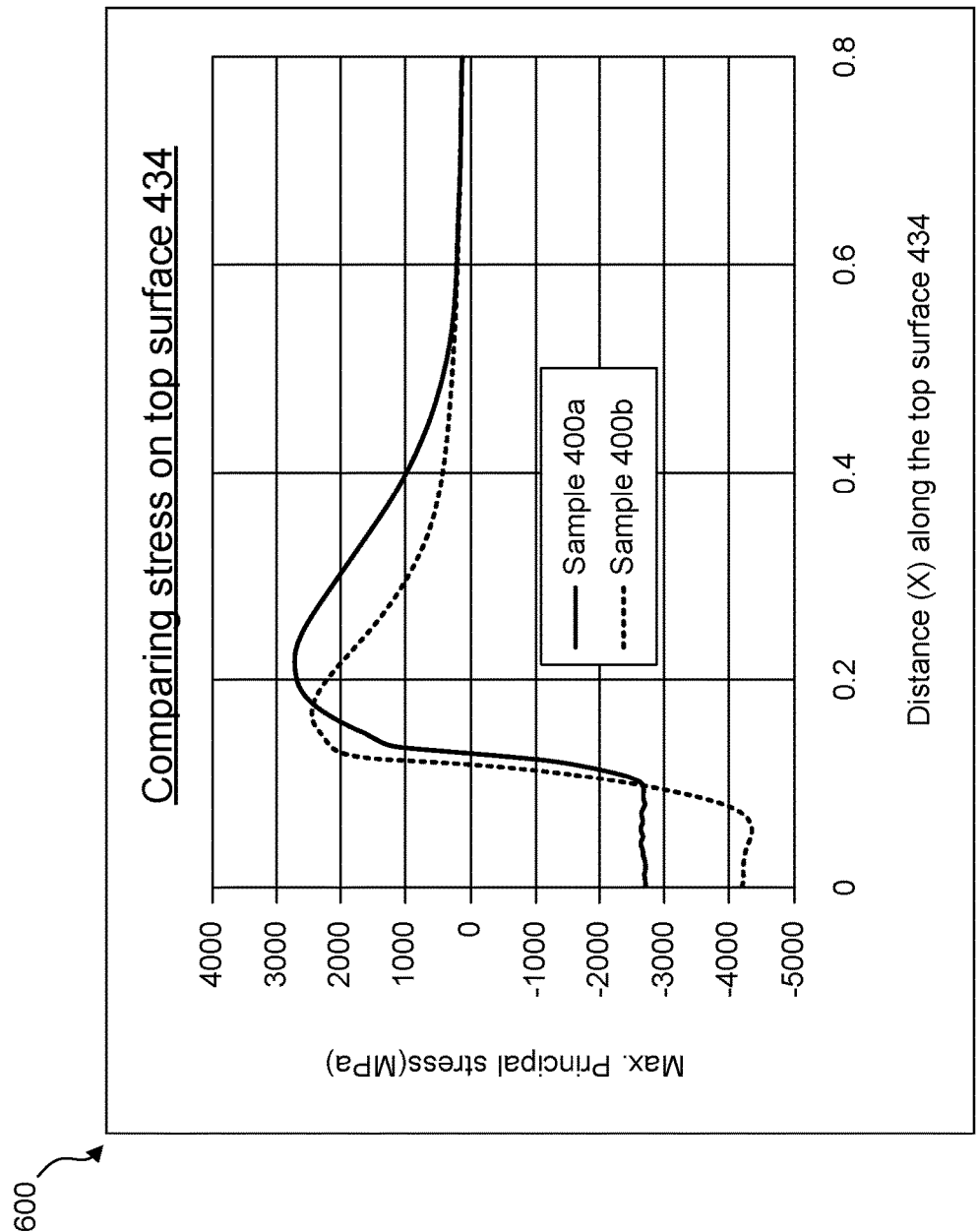
FIG. 6 is a graph of maximum principal stress on the top surface of a cover glass layer for modeled samples as a function of distance on the top surface of the cover glass layer.
Figure 7:
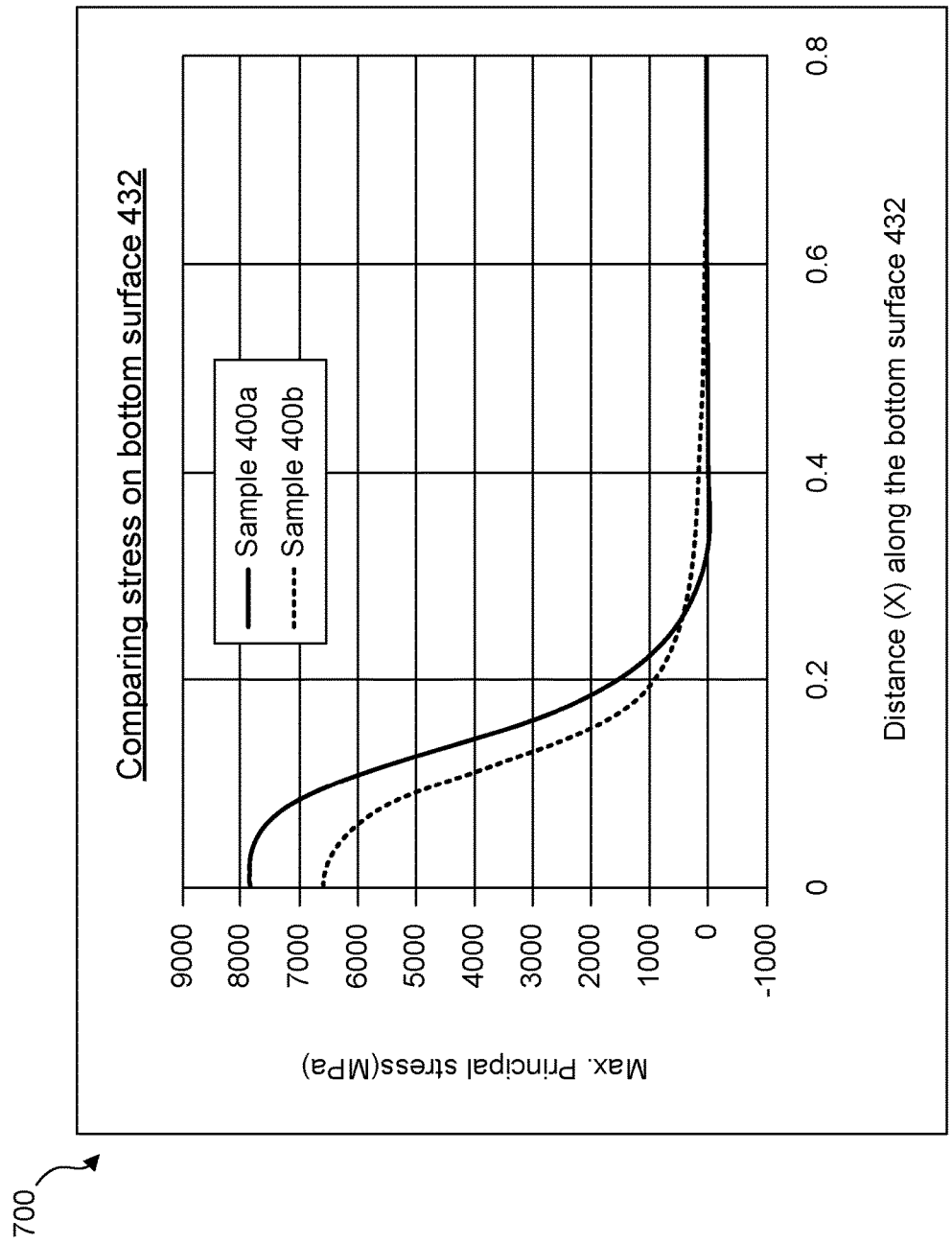
FIG. 7 is a graph of maximum principal stress on the bottom surface of a cover glass layer for modeled samples as a function of distance on the bottom surface of the cover glass layer.

FIG. 6 shows a graph 600 of the maximum principal stress distribution imparted on top surface 434 in the X-direction of model 500 for samples 400a and 400b and for a pen drop height 530 of five centimeters (cm). FIG. 7 shows a graph 700 of the maximum principal stress distribution imparted on bottom surface 432 in the X-direction of model 500 for samples 400a and 400b and for a pen drop height 530 of five centimeters (cm). In graph 600, an X-direction value of zero is the point on the top surface 434 where the center of modeled ball point tip 522 contacts top surface 434. In graph 700, an X-direction value of zero is the point on bottom surface 432 directly below the point on top surface 434 in the Z-direction where the center of modeled ball point tip 522 contacts top surface 434. Positive stress values indicate tensile stress, whereas negative stress values indicate compressive stress.

As evident in FIG. 6, the finite element analysis shows that by increasing the adhesive layer stiffness from 100 MPa to 10 GPa, the maximum principal tensile stress on top surface 434 of modeled cover glass layer 430 drops from about 2723 MPa to about 2457 MPa (a decrease of about 10%). Similarly, as shown in FIG. 7, the finite element analysis shows that the maximum principal tensile stress on bottom surface 432 of modeled cover glass layer 430 drops from about 7869 MPa to about 6590 MPa (a decrease of about 16%). These results indicate that the stiffer adhesive layer 420b of sample 400b improves impact resistance.

Figure 8:
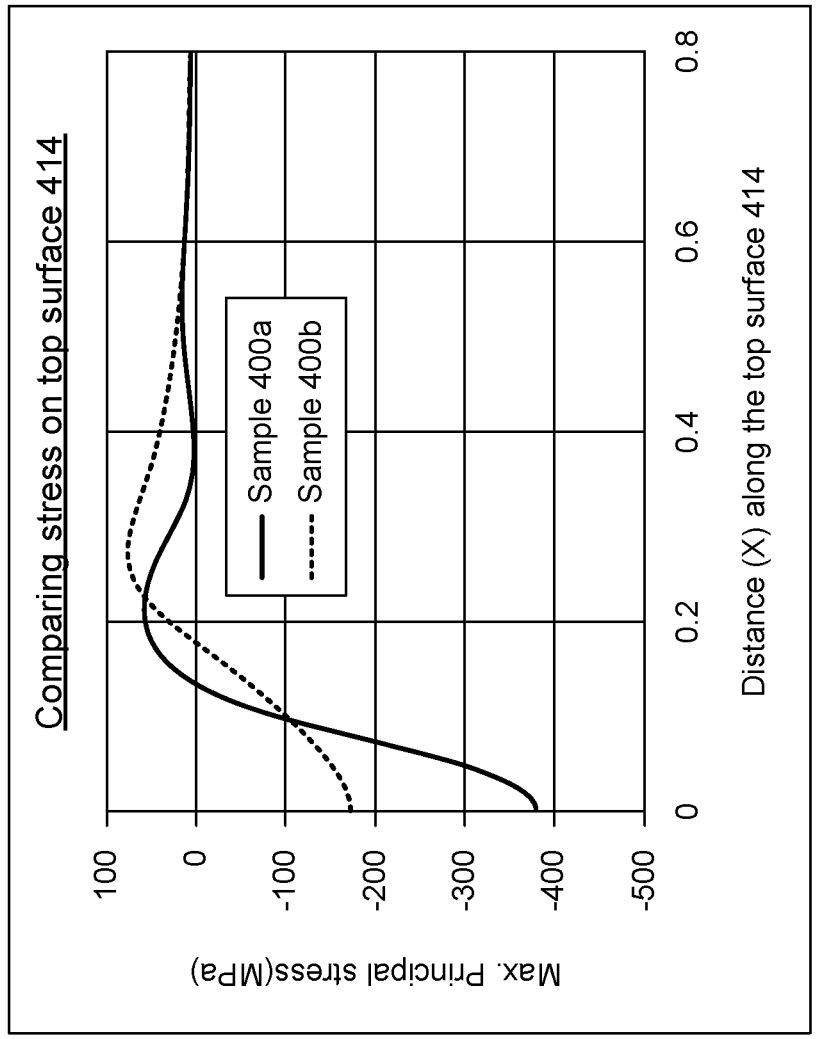
FIG. 8 is a graph of maximum principal stress on the top surface of a substrate for modeled samples as a function of distance on the top surface of the substrate.
Figure 9:
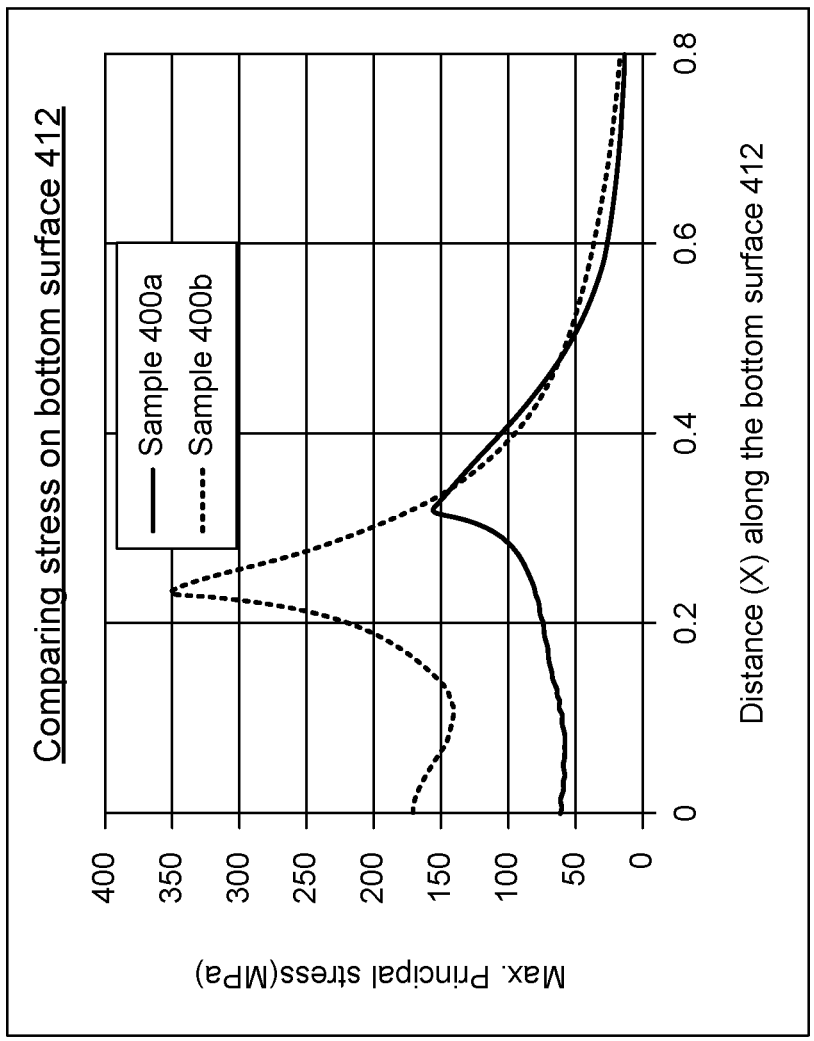
FIG. 9 is a graph of maximum principal stress on the bottom surface of a substrate for modeled samples as a function of distance on the bottom surface of the substrate.
Figure 10:
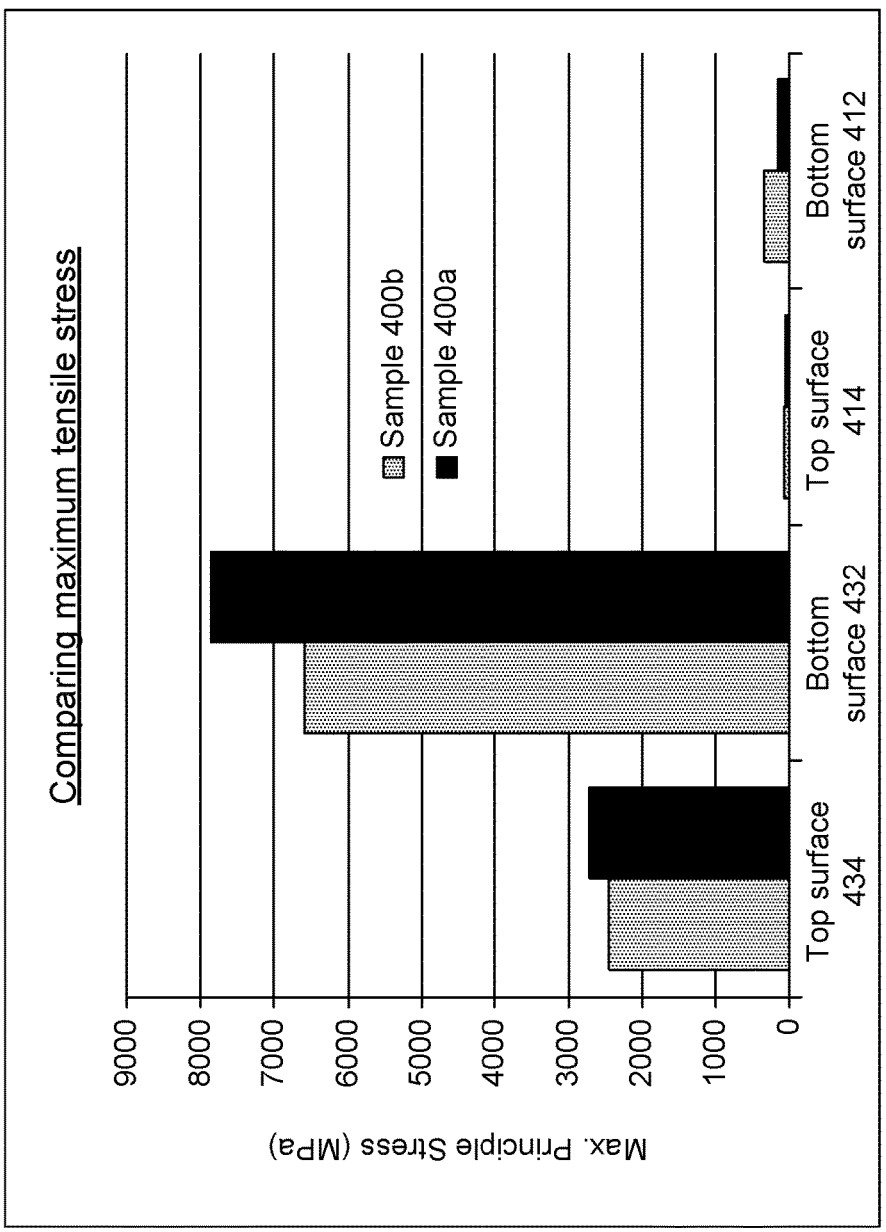
FIG. 10 is a bar graph comparing the maximum principal stresses for the top and bottom surfaces of cover glass layers and substrates for modeled samples.

As evident in graph 800 of FIG. 8, the finite element analysis shows that by increasing the adhesive layer stiffness from 100 MPa to 10 GPa, the maximum principal tensile stress on top surface 414 of substrate 410 increases by about 24%. Similarly, as evident in graph 900 of FIG. 9, the finite element analysis shows that the maximum principal tensile stress on bottom surface 412 of substrate 410 increases by about 230%. However, as illustrated in bar graph 1000 of FIG. 10, the magnitude of the maximum principal tensile stresses on these surfaces of substrate 410 is much lower than those on top surface 434 and bottom surface 432 of modeled cover glass layer 430. So, such an increase in stress does not significantly affect the overall impact resistance of the samples.

So, as shown in FIGS. 6-10, tailoring the dynamic elastic modulus of an adhesive layer to have a sufficiently high elastic modulus in a high stress frequency range, such as 10 Hertz to 1000 Hertz, can improve the impact resistance of an article. A sufficiently high elastic modulus at high stress frequency can reduce the maximum principal tensile stress imparted on top and bottom surfaces of a cover glass layer. By reducing the maximum stresses, the cover glass layer is less likely to fail during an impact event.

Figures 11A, 11B:
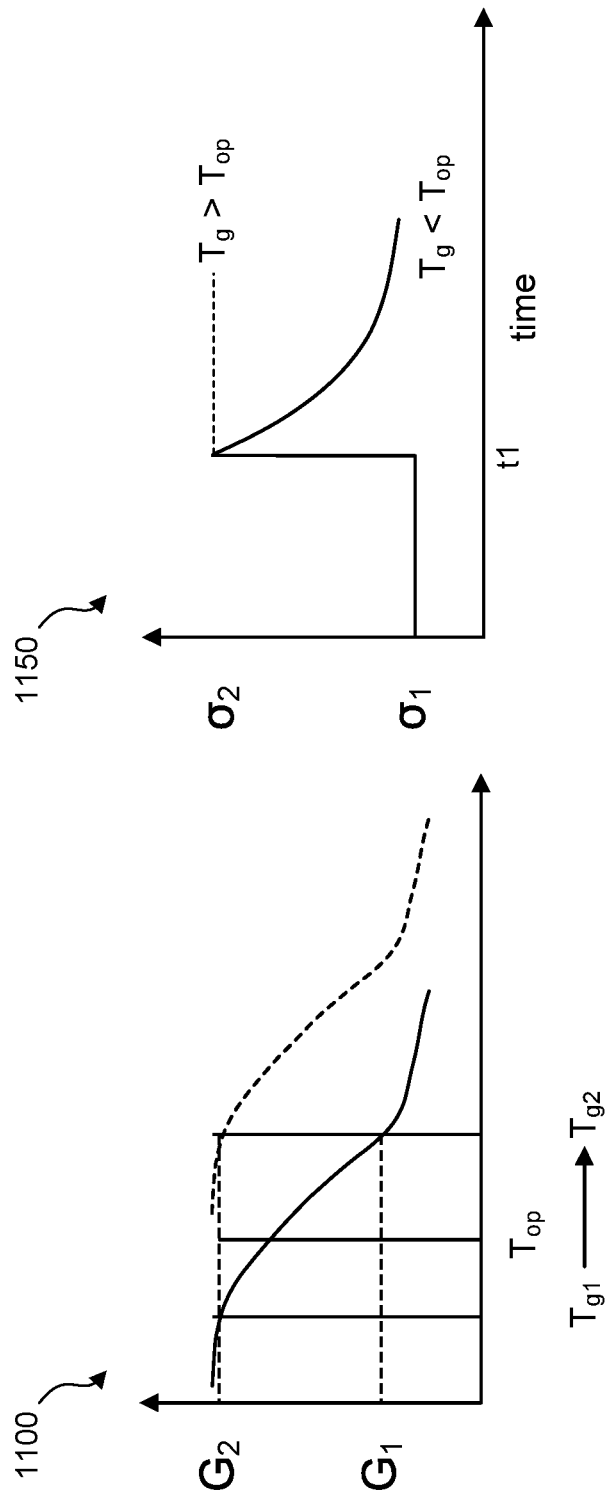
FIG. 11A is a graph of elastic modulus as a function of temperature for two different adhesive layer materials.
FIG. 11B is a graph of stress versus time for two different adhesive layer materials.

In some embodiments, adhesive layer 130 may include, consist essentially of, or consist of a material having a glass transition temperature ($T_g$) higher than the intended operating temperature of article 100. This can be beneficial, because as illustrated in graph 1100 of FIG. 11A, a material with a $T_g$ higher than the operating temperature ($T_{op}$) would be in a glassy state at the operating temperature, and thus would exhibit a relatively higher stiffness than a material with a $T_g$ less than the intended operating temperature. The dotted line in FIG. 11A illustrates the shear modulus (G) of a material with a $T_g$ higher than the operating temperature and the solid line illustrates the shear modulus of a material with a $T_g$ lower than the operating temperature. The shear modulus of the dotted line remains high at the operating temperature; thus, the material will be relatively stiff at the operating temperature. In contrast, the shear modulus of the solid line is lower at the operating temperature; thus, the material will be relatively flexible at the operating temperature. In some embodiments, the intended operating temperature of article 100 may be 23 degrees C. As shown in the model above, a stiffer adhesive material can help improve impact resistance of an article.

In some embodiments, adhesive layer 130 may include, consist essentially of, or consist of a material having a glass transition temperature ($T_g$) lower than the intended operating temperature of article 100. This can be beneficial because an adhesive as described herein with a $T_g$ lower than the operating temperature can assist in dissipating stress imparted on an article. As illustrated in graph 1150 of FIG. 11B, upon application of a stress (σ2) at time t1, a material with a $T_g$ lower than $T_{op}$ will dissipate the stress over time (illustrated with a solid line) during which the stress is applied. In contrast, for a material with a $T_g$ higher than $T_{op}$, the applied stress on the material will remain constant during the time the stress is applied (illustrated with a dotted line). The ability of a material with a $T_g$ lower than $T_{op}$ to dissipate an applied stress can be beneficial during application of a bending force and/or impact force. By dissipating the applied stress, the material relieves stress on other layers of article 100, thereby reducing the chance these layers fail.

Figure 12:
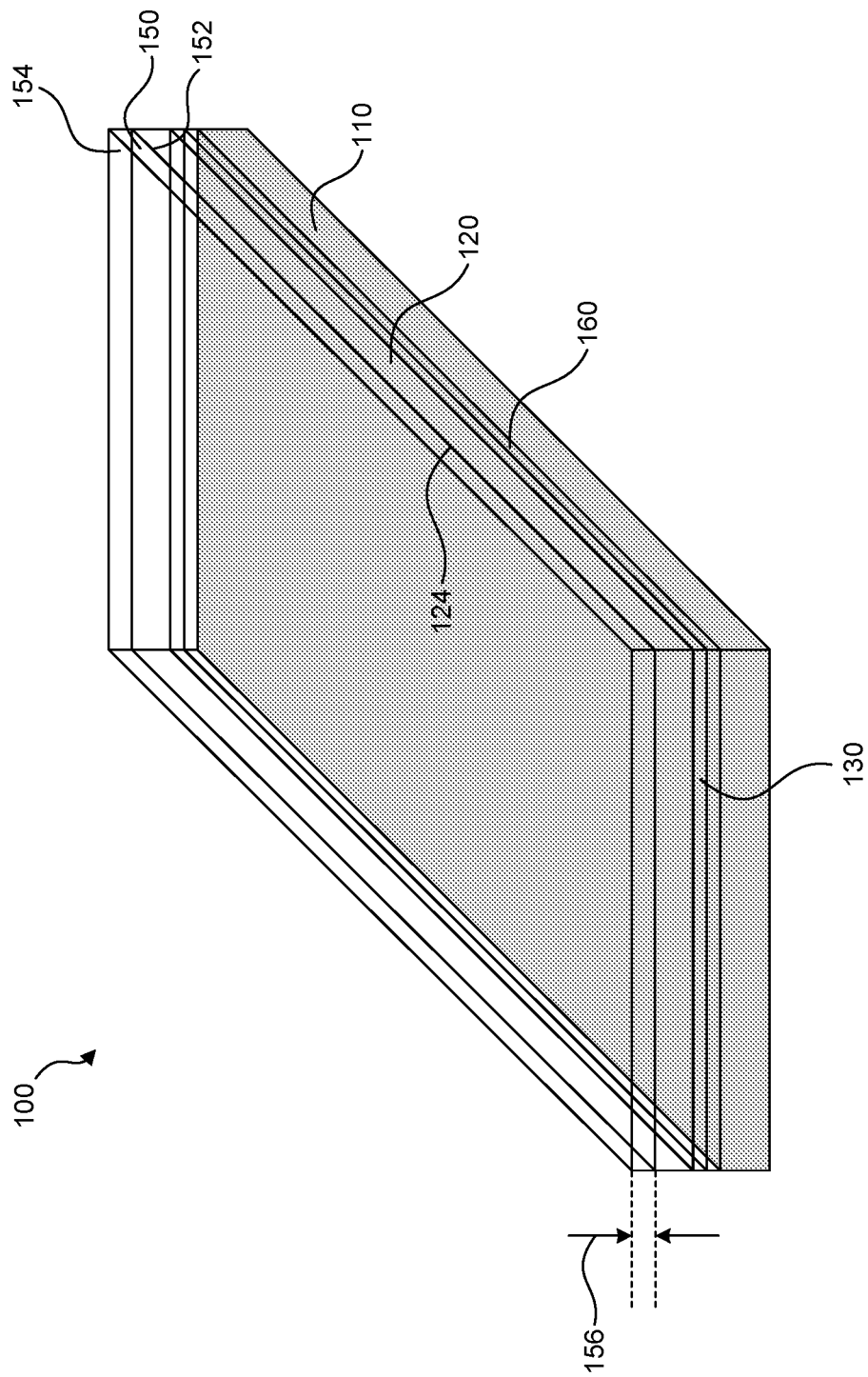
FIG. 12 illustrates an article including a coating layer according to some embodiments.

In some embodiments, for example as shown in FIG. 12, glass article 100 may be coated with a coating layer 150 having a bottom surface 152, a top surface 154, and a thickness 156. In some embodiments, a coating layer 150 may be bonded to top surface 124 of cover glass layer 120 with an adhesive layer. In some embodiments, coating layer 150 may disposed on top surface 124 of cover glass layer 120. In some embodiments, multiple coating layers 150, of the same or different types, may be coated on a glass article 100.

In some embodiments, a coating layer 150 may be an inorganic optically transparent hard-coat layer, for example a silicon dioxide ($SiO_2$) or aluminum oxide ($Al_2O_3$) layer deposited by a physical vapor deposition process, a chemical vapor deposition process or an atomic layer deposition process. In some embodiments, a coating layer 150 may be an optically transparent polymeric (OTP) hard-coat layer. An inorganic or OTP hard-coat layer may have a pencil hardness of, for example, 7H, 8H, or 9H.

Suitable materials for an OTP hard-coat layer include, but are not limited to, a polyimide, a polyethylene terephthalate (PET), a polycarbonate (PC), a poly methyl methacrylate (PMMA), organic polymer materials, inorganic-organic hybrid polymeric materials, and aliphatic or aromatic hexafunctional urethane acrylates. In some embodiments, an OTP hard-coat layer may consist essentially of an organic polymer material, an inorganic-organic hybrid polymeric material, or aliphatic or aromatic hexafunctional urethane acrylate. In some embodiments, an OTP hard-coat layer may consist of a polyimide, an organic polymer material, an inorganic-organic hybrid polymeric material, or aliphatic or aromatic hexafunctional urethane acrylate. In some embodiments, an OTP hard-coat layer may include a nanocomposite material. In some embodiments, an OTP hard-coat layer may include a nano-silicate at least one of epoxy or urethane materials. Suitable compositions for such an OTP hard-coat layer are described in U.S. Pat. Pub. No. 2015/0110990, which is hereby incorporated by reference in its entirety by reference thereto.

As used herein, "organic polymer material" means a polymeric material comprising monomers with only organic components. In some embodiments, an OTP hard-coat layer may comprise an organic polymer material manufactured by Gunze Limited and having a hardness of 9H, for example Gunze's "Highly Durable Transparent Film." As used herein, "inorganic-organic hybrid polymeric material" means a polymeric material comprising monomers with inorganic and organic components. An inorganic-organic hybrid polymer is obtained by a polymerization reaction between monomers having an inorganic group and an organic group. An inorganic-organic hybrid polymer is not a nanocomposite material comprising separate inorganic and organic constituents or phases, for example inorganic particulate dispersed within an organic matrix.

In some embodiments, the inorganic-organic hybrid polymeric material may include polymerized monomers comprising an inorganic silicon-based group, for example, a silsesquioxane polymer. A silsesquioxane polymer may be, for example, an alky-silsesquioxane, an aryl-silsesquioxane, or an aryl alkyl-silsesquioxane having the following chemical structure: $(RSiO_{1.5})n$, where R is an organic group for example, but not limited to, methyl or phenyl. In some embodiments, an OTP hard-coat layer may comprise a silsesquioxane polymer combined with an organic matrix, for example, SILPLUS manufactured by Nippon Steel Chemical Co., Ltd.

In some embodiments, an OTP hard-coat layer may comprise 90 wt % to 95 wt % aromatic hexafunctional urethane acrylate (e.g., PU662NT (Aromatic hexafunctional urethane acrylate) manufactured by Miwon Specialty Chemical Co.) and 10 wt % to 5 wt % photo-initiator (e.g., Darocur 1173 manufactured by Ciba Specialty Chemicals Corporation) with a hardness of 8H or more. In some embodiments, an OTP hard-coat layer composed of an aliphatic or aromatic hexafunctional urethane acrylate may be formed as a stand-alone layer by spin-coating the layer on a polyethylene terephthalate (PET) substrate, curing the urethane acrylate, and removing the urethane acrylate layer from the PET substrate.

An OTP hard-coat layer may have a thickness 156 in the range of 10 microns to 120 microns, including subranges therebetween. For example, an OTP hard-coat layer may have a thickness 156 of 10 microns, 20 microns, 30 microns, 40 microns, 50 microns, 60 microns, 70 microns, 80 microns, 90 microns, 100 microns, 110 microns, 120 microns, or within a range having any two of these values as endpoints. In some embodiments, an OTP hard-coat layer may be a single monolithic layer.

In some embodiments, an OTP hard-coat layer may be an inorganic-organic hybrid polymeric material layer or an organic polymer material layer having a thickness in the range of 80 microns to 120 microns, including subranges therebetween. For example, an OTP hard-coat layer comprising an inorganic-organic hybrid polymeric material, or an organic polymer material may have a thickness of 80 microns, 90 microns, 100 microns, 110 microns, 120 microns, or within a range having any two of these values as end points. In some embodiments, an OTP hard-coat layer may be an aliphatic or aromatic hexafunctional urethane acrylate material layer having a thickness in the range of 10 microns to 60 microns, including subranges therebetween. For example, an OTP hard-coat layer comprising an aliphatic or aromatic hexafunctional urethane acrylate material may have a thickness of 10 microns, 20 microns, 30 microns, 40 microns, 50 microns, 60 microns, or within a range having any two of these values as end points.

In some embodiments, coating layer(s) 150 may be an anti-reflection coating layer. Exemplary materials suitable for use in the anti-reflection coating layer include: $SiO_2$, $Al_2O_3$, $GeO_2$, SiO, $AlO_xN_y$, AlN, $SiN_x$, $SiO_xN_y$, $Si_uAl_vO_xN_y$, $Ta_2O_5$, $Nb_2O_5$, $TiO_2$, $ZrO_2$, TiN, MgO, $MgF_2$, $BaF_2$, $CaF_2$, $SnO_2$, $HfO_2$, $Y_2O_3$, $MoO_3$, $DyF_3$, $YbF_3$, $YF_3$, $CeF_3$, polymers, fluoropolymers, plasma-polymerized polymers, siloxane polymers, silsesquioxanes, polyimides, fluorinated polyimides, polyetherimide, polyethersulfone, polyphenylsulfone, polycarbonate, polyethylene terephthalate, polyethylene naphthalate, acrylic polymers, urethane polymers, polymethylmethacrylate, and other materials cited above as suitable for use in a scratch resistant layer. An anti-reflection coating layer may include sub-layers of different materials.

In some embodiments, the anti-reflection coating layer may include a hexagonally packed nanoparticle layer, for example but not limited to, the hexagonally packed nanoparticle layers described in U.S. Pat. No. 9,272,947, issued Mar. 1, 2016, which is hereby incorporated by reference in its entirety by reference thereto. In some embodiments, the anti-reflection coating layer may include a nanoporous Si-containing coating layer, for example but not limited to the nanoporous Si-containing coating layers described in WO2013/106629, published on Jul. 18, 2013, which is hereby incorporated by reference in its entirety by reference thereto. In some embodiments, the anti-reflection coating may include a multilayer coating, for example, but not limited to the multilayer coatings described in WO2013/106638, published on Jul. 18, 2013; WO2013/082488, published on Jun. 6, 2013; and U.S. Pat. No. 9,335,444, issued on May 10, 2016, all of which are hereby incorporated by reference in their entirety by reference thereto.

In some embodiments, coating layer(s) 150 may be an easy-to-clean coating layer. In some embodiments, the easy-to-clean coating layer may include a material selected from the group consisting of fluoroalkylsilanes, perfluoropolyether alkoxy silanes, perfluoroalkyl alkoxy silanes, fluoroalkylsilane-(non-fluoroalkylsilane) copolymers, and mixtures of fluoroalkylsilanes. In some embodiments, the easy-to-clean coating layer may include one or more materials that are silanes of selected types containing perfluorinated groups, for example, perfluoroalkyl silanes of formula $(RF)_ySiX_{4-y}$, where RF is a linear $C_6$-$C_{30}$ perfluoroalkyl group, X=Cl, acetoxy, $-OCH_3$, and $-OCH_2CH_3$, and y=2 or 3. The perfluoroalkyl silanes can be obtained commercially from many vendors including Dow-Corning (for example fluorocarbons 2604 and 2634), 3MCompany (for example ECC-1000 and ECC-4000), and other fluorocarbon suppliers, for example Daikin Corporation, Ceko (South Korea), Cotec-GmbH (DURALON UltraTec materials) and Evonik. In some embodiments, the easy-to-clean coating layer may include an easy-to-clean coating layer as described in WO2013/082477, published on Jun. 6, 2013, which is hereby incorporated by reference in its entirety by reference thereto.

In some embodiments, coating layer(s) 150 may be an anti-glare layer formed on top surface 124 of cover glass layer 120. Suitable anti-glare layers include, but are not limited to, the anti-glare layers prepared by the processes described in U.S. Pat. Pub. Nos. 2010/0246016, 2011/0062849, 2011/0267697, 2011/0267698, 2015/0198752, and 2012/0281292, all of which are hereby incorporated by reference in their entirety by reference thereto.

In some embodiments, coating layer(s) 150 may be an anti-fingerprint coating layer. Suitable anti-fingerprint coating layers include, but are not limited to, oleophobic surface layers including gas-trapping features, as described in, for example, U.S. Pat. App. Pub. No. 2011/0206903, published Aug. 25, 2011, and oleophilic coatings formed from an uncured or partially-cured siloxane coating precursor comprising an inorganic side chain that is reactive with the surface of the glass or glass-ceramic substrate (e.g., partially-cured linear alkyl siloxane), as described in, for example, U.S. Pat. App. Pub. No. 2013/0130004, published May 23, 2013. The contents of U.S. Pat. App. Pub. No. 2011/0206903 and U.S. Pat. App. Pub. No. 2013/0130004 are incorporated herein by reference in their entirety.

In some embodiments, coating layer(s) 150 may be an anti-microbial and/or anti-viral layer may be formed on top surface 124 of cover glass layer 120. Suitable anti-microbial and/or anti-viral layers include, but are not limited to, an antimicrobial Ag+ region extending from the surface of the glass article to a depth in the glass article having a suitable concentration of Ag+1 ions on the surface of the glass article, as described in, for example, U.S. Pat. App. Pub. No. 2012/0034435, published Feb. 9, 2012, and U.S. Pat. App. Pub. No. 2015/0118276, published Apr. 30, 2015. The contents of U.S. Pat. App. Pub. No. 2012/0034435 and U.S. Pat. App. Pub. No. 2015/0118276 are incorporated herein by reference in their entirety.

Figure 13:
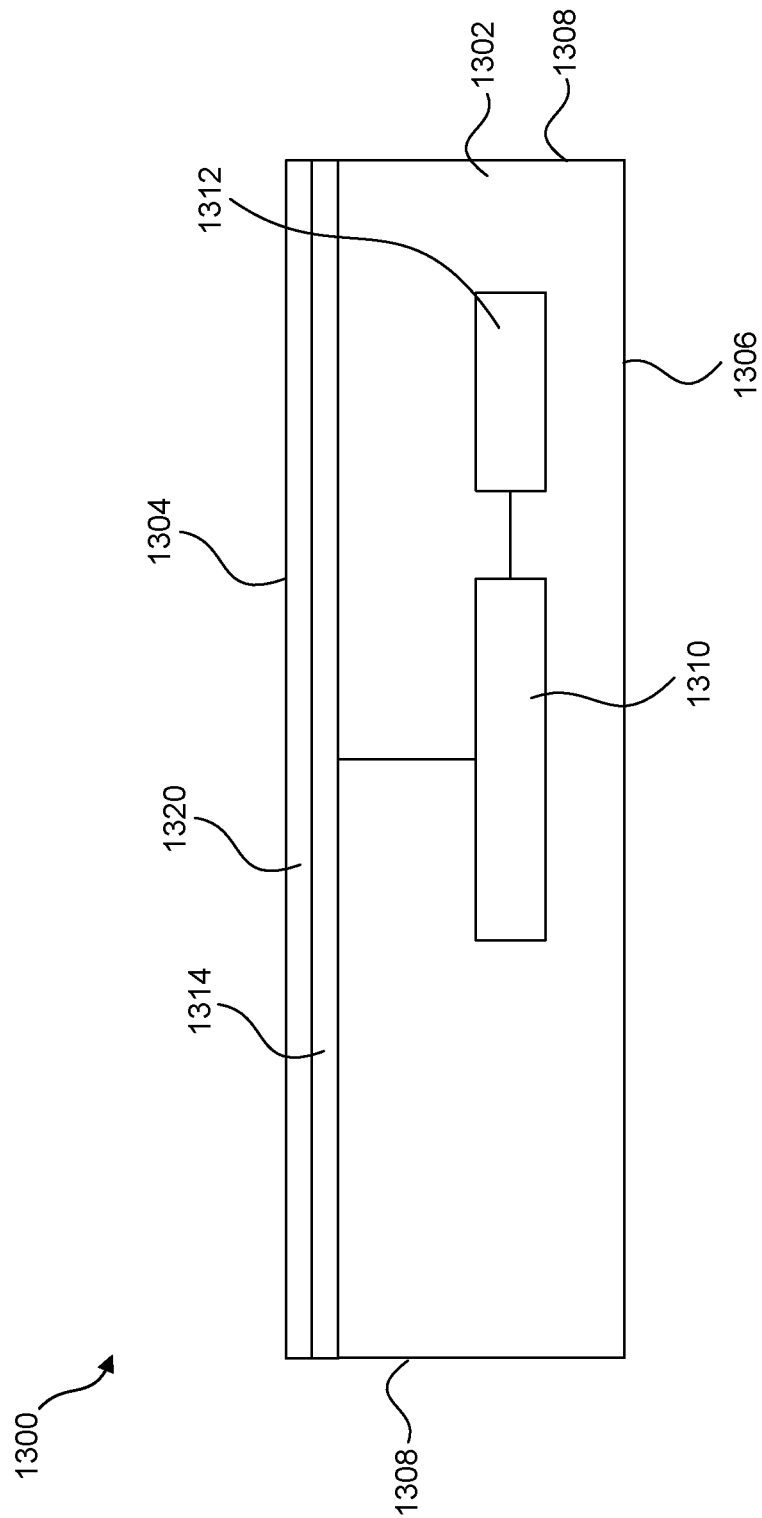
FIG. 13 illustrates a consumer product according to some embodiments.

FIG. 13 shows a consumer electronic product 1300 according to some embodiments. Consumer electronic product 1300 may include a housing 1302 having a front (user-facing) surface 1304, a back surface 1306, and side surfaces 1308. Electrical components may be at least partially within housing 1302. The electrical components may include, among others, a controller 1310, a memory 1312, and display components, including a display 1314. In some embodiments, display 1314 may be at or adjacent to front surface 1304 of housing 1302. Display 1314 may be, for example, a light emitting diode (LED) display or an organic light emitting diode (OLED) display.

As shown for example in FIG. 13, consumer electronic product 1300 may include a cover substrate 1320. Cover substrate 1320 may be a cover glass layer as disclosed herein. Cover substrate 1320 may serve to protect display 1314 and other components of consumer electronic product 1300 (e.g., controller 1310 and memory 1312) from damage. In some embodiments, cover substrate 1320 may be disposed over display 1314. In some embodiments, cover substrate 1320 may be bonded to display 1314 with an adhesive layer as disclosed herein. Cover substrate 1320 may be a 2D, 2.5D, or 3D cover substrate. In some embodiments, cover substrate 1320 may define front surface 1304 of housing 1302. In some embodiments, cover substrate 1320 may define front surface 1304 of housing 1302 and all or a portion of side surfaces 1308 of housing 1302. In some embodiments, consumer electronic product 1300 may include a cover substrate defining all or a portion of back surface 1306 of housing 1302.

As used herein the term "glass" is meant to include any material made at least partially of glass, including glass and glass-ceramics. "Glass-ceramics" include materials produced through controlled crystallization of glass. In embodiments, glass-ceramics have about 30% to about 90% crystallinity. Non-limiting examples of glass ceramic systems that may be used include $Li_2O \times Al_2O_3 \times nSiO_2$ (i.e. LAS system), $MgO \times Al_2O_3 \times nSiO_2$ (i.e. MAS system), and $ZnO \times Al_2O_3 \times nSiO_2$ (i.e. ZAS system).

Examples of suitable glass include soda lime glass, alkali aluminosilicate glass, alkali containing borosilicate glass and alkali aluminoborosilicate glass. In some variants, the glass may either include lithia or be free of lithia. In one or more alternative embodiments, the glass may be a crystalline glass, for example a glass-ceramic (which may be strengthened or non-strengthened) or may include a single crystal structure, for example sapphire. In one or more specific embodiments, a glass layer may include an amorphous glass base and a crystalline cladding (e.g., sapphire layer, a polycrystalline alumina layer and/or or a spinel ($MgAl_2O_4$) layer).

In some embodiments, the glass composition for glass layers discussed herein may include 40 mol % to 90 mol % $SiO_2$ (silicon oxide). In some embodiments, the glass composition may include 40 mol %, 45 mol %, 50 mol %, 55 mol %, 60 mol %, 65 mol %, 70 mol %, 75 mol %, 80 mol %, 85 mol %, or 90 mol % $SiO_2$, or a mol % within any range having any two of these values as end points. In some embodiments, the glass composition may include 55 mol % to 70 mol % $SiO_2$. In some embodiments, the glass composition may include 57.43 mol % to 68.95 mol % $SiO_2$.

In some embodiments, the glass composition for glass layers discussed herein may include 1 mol % to 10 mol % $B_2O_3$ (boron oxide). In some embodiments, the glass composition may include 1 mol %, 2 mol %, 3 mol %, 4 mol %, 5 mol %, 6 mol %, 7 mol %, 8 mol %, 9 mol %, or 10 mol % $B_2O_3$, or a mol % within any range having any two of these values as end points. In some embodiments, the glass composition may include 3 mol % to 6 mol % $B_2O_3$. In some embodiments, the glass composition may include 3.86 mol % to 5.11 mol % $B_2O_3$. In some embodiments, the glass composition may not include $B_2O_3$.

In some embodiments, the glass composition for glass layers discussed herein may include 5 mol % to 30 mol % $Al_2O_3$ (aluminum oxide). In some embodiments, the glass composition may include 5 mol %, 10 mol %, 15 mol %, 20 mol %, 25 mol %, or 30 mol % $Al_2O_3$, or a mol % within any range having any two of these values as end points. In some embodiments, the glass composition may include 10 mol % to 20 mol % $Al_2O_3$. In some embodiments, the glass composition may include 10.27 mol % to 16.10 mol % $Al_2O_3$.

In some embodiments, the glass composition for glass layers discussed herein may include 1 mol % to 10 mol % $P_2O_5$ (phosphorus oxide). In some embodiments, the glass composition may include 1 mol %, 2 mol %, 3 mol %, 4 mol %, 5 mol %, 6 mol %, 7 mol %, 8 mol %, 9 mol %, or 10 mol % $P_2O_5$, or a mol % within any range having any two of these values as end points. In some embodiments, the glass composition may include 2 mol % to 7 mol % $P_2O_5$. In some embodiments, the glass composition may include 2.47 mol % to 6.54 mol % $P_2O_5$. In some embodiments, the glass composition may not include $P_2O_5$.

In some embodiments, the glass composition for glass layers discussed herein may include 5 mol % to 30 mol % $Na_2O$ (sodium oxide). In some embodiments, the glass composition may include 5 mol %, 10 mol %, 15 mol %, 20 mol %, 25 mol %, or 30 mol % $Na_2O$, or a mol % within any range having any two of these values as end points. In some embodiments, the glass composition may include 10 mol % to 20 mol % $Na_2O$. In some embodiments, the glass composition may include 10.82 mol % to 17.05 mol % $Na_2O$.

In some embodiments, the glass composition for glass layers discussed herein may include 0.01 mol % to 0.05 mol % $K_2O$ (potassium oxide). In some embodiments, the glass composition may include 0.01 mol %, 0.02 mol %, 0.03 mol %, 0.04 mol %, or 0.05 mol % $K_2O$, or a mol % within any range having any two of these values as end points. In some embodiments, the glass composition may include 0.01 mol % $K_2O$. In some embodiments, the glass composition may not include $K_2O$.

In some embodiments, the glass composition for glass layers discussed herein may include 1 mol % to 10 mol % MgO (magnesium oxide). In some embodiments, the glass composition may include 1 mol %, 2 mol %, 3 mol %, 4 mol %, 5 mol %, 6 mol %, 7 mol %, 8 mol %, 9 mol %, or 10 mol % MgO, or a mol % within any range having any two of these values as end points. In some embodiments, the glass composition may include 2 mol % to 6 mol % MgO. In some embodiments, the glass composition may include 2.33 mol % to 5.36 mol % MgO. In some embodiments, the glass composition may not include MgO.

In some embodiments, the glass composition for glass layers discussed herein may include 0.01 mol % to 0.1 mol % CaO (calcium oxide). In some embodiments, the glass composition may include 0.01 mol %, 0.02 mol %, 0.03 mol %, 0.04 mol %, 0.05 mol %, 0.06 mol %, 0.07 mol %, 0.08 mol %, 0.09 mol %, or 0.1 mol % CaO, or a mol % within any range having any two of these values as end points. In some embodiments, the glass composition may include 0.03 mol % to 0.06 mol % CaO. In some embodiments, the glass composition may not include CaO.

In some embodiments, the glass composition for glass layers discussed herein may include 0.01 mol % to 0.05 mol % $Fe_2O_3$ (iron oxide). In some embodiments, the glass composition may include 0.01 mol %, 0.02 mol %, 0.03 mol %, 0.04 mol %, or 0.05 mol % $Fe_2O_3$, or a mol % within any range having any two of these values as end points. In some embodiments, the glass composition may include 0.01 mol % $Fe_2O_3$. In some embodiments, the glass composition may not include $Fe_2O_3$.

In some embodiments, the glass composition for glass layers discussed herein may include 0.5 mol % to 2 mol % ZnO (zinc oxide). In some embodiments, the glass composition may include 0.5 mol %, 1 mol %, 1.5 mol %, or 2 mol % ZnO, or a mol % within any range having any two of these values as end points. In some embodiments, the glass composition may include 1.16 mol % ZnO. In some embodiments, the glass composition may not include ZnO.

In some embodiments, the glass composition for glass layers discussed herein may include 1 mol % to 10 mol % $Li_2O$ (lithium oxide). In some embodiments, the glass composition may include 1 mol %, 2 mol %, 3 mol %, 4 mol %, 5 mol %, 6 mol %, 7 mol %, 8 mol %, 9 mol %, or 10 mol % $Li_2O$, or a mol % within any range having any two of these values as end points. In some embodiments, the glass composition may include 5 mol % to 7 mol % $Li_2O$. In some embodiments, the glass composition may include 6.19 mol % $Li_2O$. In some embodiments, the glass composition may not include $Li_2O$.

In some embodiments, the glass composition for glass layers discussed herein may include 0.01 mol % to 0.3 mol % $SnO_2$ (tin oxide). In some embodiments, the glass composition may include 0.01 mol %, 0.05 mol %, 0.1 mol %, 0.15 mol %, 0.2 mol %, 0.25 mol %, or 0.3 mol %, $SnO_2$, or a mol % within any range having any two of these values as end points. In some embodiments, the glass composition may include 0.01 mol % to 0.2 mol % $SnO_2$. In some embodiments, the glass composition may include 0.04 mol % to 0.17 mol % $SnO_2$.

In some embodiments, the glass composition for glass layers discussed herein may be a composition including a value for $R_2O$ (alkali metal oxide(s))+RO (alkali earth metal oxide(s)) in the range of 10 mol % to 30 mol %. In some embodiments, $R_2O$+RO may be 10 mol %, 15 mol %, 20 mol %, 25 mol %, or 30 mol %, or a mol % within any range having any two of these values as end points. In some embodiments, $R_2O$+RO may be in the range of 15 mol % to 25 mol %. In some embodiments, $R_2O$+RO may be in the range of 16.01 mol % to 20.61 mol %.

A substrate or layer may be strengthened to form a strengthened substrate or layer. As used herein, the terms "strengthened substrate" or "strengthened layer" may refer to a substrate and/or layer that has been chemically strengthened, for example through ion exchange of larger ions for smaller ions in the surface of the substrate and/or layer. Other strengthening methods in the art, for example thermal tempering, or utilizing a mismatch of the coefficient of thermal expansion between portions of the substrate and/or layer to create compressive stress and central tension regions, may also be utilized to form strengthened substrates and/or layers.

Where the substrate and/or layer is chemically strengthened by an ion exchange process, the ions in the surface layer of the substrate and/or layer are replaced by—or exchanged with—larger ions having the same valence or oxidation state. Ion exchange processes are typically carried out by immersing a substrate and/or layer in a molten salt bath containing the larger ions to be exchanged with the smaller ions in the substrate. It will be appreciated by those skilled in the art that parameters for the ion exchange process, including, but not limited to, bath composition and temperature, immersion time, the number of immersions of the substrate and/or layer in a salt bath (or baths), use of multiple salt baths, additional steps, for example annealing, washing, and the like, are generally determined by the composition of the substrate and/or layer and the desired compressive stress (CS), depth of compressive stress layer (or depth of layer) of the substrate that result from the strengthening operation. By way of example, ion exchange of alkali metal-containing glass substrates and/or layers may be achieved by immersion in at least one molten bath containing a salt for example, but not limited to, nitrates, sulfates, and chlorides of the larger alkali metal ion. The temperature of the molten salt bath typically is in a range from about 380° C. up to about 450° C., while immersion times range from about 15 minutes up to about 40 hours. However, temperatures and immersion times different from those described above may also be used.

In addition, non-limiting examples of ion exchange processes in which glass substrates and/or layers are immersed in multiple ion exchange baths, with washing and/or annealing steps between immersions, are described in U.S. patent application Ser. No. 12/500,650, filed Jul. 10, 2009, by Douglas C. Allan et al., entitled "Glass with Compressive Surface for Consumer Applications," claiming priority from U.S. Provisional Patent Application No. 61/079,995, filed Jul. 11, 2008, and patented as U.S. Pat. No. 8,561,429 on Oct. 22, 2013, in which glass substrates are strengthened by immersion in multiple, successive, ion exchange treatments in salt baths of different concentrations; and U.S. Pat. No. 8,312,739, by Christopher M. Lee et al., issued on Nov. 20, 2012, and entitled "Dual Stage Ion Exchange for Chemical Strengthening of Glass," and claiming priority from U.S. Provisional Patent Application No. 61/084,398, filed Jul. 29, 2008, in which glass substrates are strengthened by ion exchange in a first bath is diluted with an effluent ion, followed by immersion in a second bath having a smaller concentration of the effluent ion than the first bath. The contents of U.S. Pat. Nos. 8,561,429 and 8,312,739 are incorporated herein by reference in their entirety.

While various embodiments have been described herein, they have been presented by way of example, and not limitation. It should be apparent that adaptations and modifications are intended to be within the meaning and range of equivalents of the disclosed embodiments, based on the teaching and guidance presented herein. It therefore will be apparent to one skilled in the art that various changes in form and detail can be made to the embodiments disclosed herein without departing from the spirit and scope of the present disclosure. The elements of the embodiments presented herein are not necessarily mutually exclusive, but may be interchanged to meet various situations as would be appreciated by one of skill in the art.

Embodiments of the present disclosure are described in detail herein with reference to embodiments thereof as illustrated in the accompanying drawings, in which like reference numerals are used to indicate identical or functionally similar elements. References to "one embodiment," "an embodiment," "some embodiments," "in certain embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The examples are illustrative, but not limiting, of the present disclosure. Other suitable modifications and adaptations of the variety of conditions and parameters normally encountered in the field, and which would be apparent to those skilled in the art, are within the spirit and scope of the disclosure.

The term "or," as used herein, is inclusive; more specifically, the phrase "A or B" means "A, B, or both A and B." Exclusive "or" is designated herein by terms such as "either A or B," for example.

The indefinite articles "a" and "an" to describe an element or component means that one or at least one of these elements or components is present. Although these articles are conventionally employed to signify that the modified noun is a singular noun, as used herein the articles "a" and "an" also include the plural, unless otherwise stated in specific instances. Similarly, the definite article "the," as used herein, also signifies that the modified noun may be singular or plural, again unless otherwise stated in specific instances.

As used in the claims, "comprising" is an open-ended transitional phrase. A list of elements following the transitional phrase "comprising" is a non-exclusive list, such that elements in addition to those specifically recited in the list may also be present. As used in the claims, "consisting essentially of" or "composed essentially of" limits the composition of a material to the specified materials and those that do not materially affect the basic and novel characteristic(s) of the material. As used in the claims, "consisting of" or "composed entirely of" limits the composition of a material to the specified materials and excludes any material not specified.

The term "wherein" is used as an open-ended transitional phrase, to introduce a recitation of a series of characteristics of the structure.

Where a range of numerical values is recited herein, comprising upper and lower values, unless otherwise stated in specific circumstances, the range is intended to include the endpoints thereof, and all integers and fractions within the range. It is not intended that the scope of the claims be limited to the specific values recited when defining a range. Further, when an amount, concentration, or other value or parameter is given as a range, one or more preferred ranges or a list of upper preferable values and lower preferable values, this is to be understood as specifically disclosing all ranges formed from any pair of any upper range limit or preferred value and any lower range limit or preferred value, regardless of whether such pairs are separately disclosed. Finally, when the term "about" is used in describing a value or an end-point of a range, the disclosure should be understood to include the specific value or end-point referred to. Whether or not a numerical value or end-point of a range recites "about," the numerical value or end-point of a range is intended to include two embodiments: one modified by "about," and one not modified by "about."

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art.

The terms "substantial," "substantially," and variations thereof as used herein are intended to note that a described feature is equal or approximately equal to a value or description. For example, a "substantially planar" surface is intended to denote a surface that is planar or approximately planar. Moreover, "substantially" is intended to denote that two values are equal or approximately equal. In some embodiments, "substantially" may denote values within about 10% of each other, for example within about 5% of each other, or within about 2% of each other.

The present embodiment(s) have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

It is to be understood that the phraseology or terminology used herein is for the purpose of description and not of limitation. The breadth and scope of the present disclosure should not be limited by any of the above-described exemplary embodiments, but should be defined in accordance with the following claims and their equivalents.

What is claimed is:

1. An article comprising:
   a substrate;
   a cover glass layer disposed over a top surface of the substrate, the cover glass layer comprising a thickness in a range of 1 micron to 200 microns; and
   an adhesive layer disposed between a bottom surface of the cover glass layer and the top surface of the substrate, the adhesive layer comprising a dynamic elastic modulus comprising:
      a first elastic modulus in a range of 10 kPa to 1000 kPa measured at a stress frequency in a range of 0 Hertz to 5 Hertz and a temperature of 23 degrees C., and
      a second elastic modulus of 500 MPa or more measured at a stress frequency in a range of 10 Hertz to 1000 Hertz and a temperature of 23 degrees C.

2. The article of claim 1, wherein the second elastic modulus is in a range of 500 MPa to 10 GPa.

3. The article of claim 1, wherein the first elastic modulus is in a range of 10 kPa to 1000 kPa across the stress frequency range of 0 Hertz to 5 Hertz.

4. The article of claim 1, wherein the adhesive layer is optically transparent.

5. The article of claim 1, wherein the cover glass layer comprises a thickness in a range of 1 micron to 125 microns.

6. The article of claim 1, wherein the cover glass layer is directly bonded to the top surface of the substrate with the adhesive layer.

7. The article of claim 1, wherein the adhesive layer comprises a viscoelastic material.

8. The article of claim 1, wherein the adhesive layer comprises a shear thickening material.

9. The article of claim 8, wherein the shear thickening material comprises colloidal nanoparticles dispersed in a solution, and wherein an average particle size of the colloidal nanoparticles is 200 nanometers or less.

10. The article of claim 9, wherein the colloidal nanoparticles comprise a first refractive index and the solution comprises a second refractive index, and a difference between the first refractive index and the second refractive index is 0.02 or less.

11. The article of claim 1, wherein the substrate comprises an electronic display comprising a display surface defining at least a portion of the top surface of the substrate.

12. The article of claim 1, further comprising a coating layer disposed on a top surface of the cover glass layer, wherein the coating layer comprises at least one of an anti-reflection coating layer, an anti-glare coating layer, an anti-fingerprint coating layer, an anti-microbial coating layer, or an easy-to-clean coating layer.

13. The article of claim 1, wherein at least one of a top surface or the bottom surface of the cover glass layer comprises a compressive stress, and a concentration of metal oxide through a thickness of the cover glass layer is different at two or more points.

14. The article of claim 1, further comprising:
a housing comprising a front surface, a back surface and side surfaces; and
electrical components at least partially within the housing, the electrical components comprising a controller, a memory, and an electronic display, the electronic display at or adjacent the front surface of the housing,
wherein the cover glass layer forms at least a portion of the housing.

15. An electronic display component, comprising:
an electronic display comprising a display surface;
a cover glass layer disposed over the display surface, the cover glass layer comprising a thickness in a range of 1 micron to 200 microns; and
an optically transparent adhesive layer disposed between a bottom surface of the cover glass layer and the display surface of the electronic display, the adhesive layer comprising a dynamic elastic modulus comprising:
a first elastic modulus in a range of 10 kPa to 1000 kPa measured at a stress frequency in a range of 0 Hertz to 5 Hertz and a temperature of 23 degrees C., and
a second elastic modulus of 500 MPa or more measured at a stress frequency in a range of 10 Hertz to 1000 Hertz and a temperature of 23 degrees C.

16. The electronic display component of claim 15, wherein the optically transparent adhesive layer comprises a viscoelastic material.

17. The electronic display component of claim 15, wherein the optically transparent adhesive layer comprises a shear thickening material.

18. The electronic display component of claim 15, wherein the optically transparent adhesive layer comprises a thickness in a range of 25 microns to 75 microns.

19. A method of making an electronic display component, the method comprising:
disposing an optically transparent adhesive layer between a top, user-facing surface of an electronic display and a bottom surface of a glass layer, the glass layer comprising a top, user-facing surface opposite the bottom surface and a thickness in a range of 1 micron to 200 microns, and
wherein the adhesive layer comprises a dynamic elastic modulus comprising:
a first elastic modulus in a range of 10 kPa to 1000 kPa measured at a stress frequency in a range of 0 Hertz to 5 Hertz and a temperature of 23 degrees C., and
a second elastic modulus of 500 MPa or more measured at a stress frequency in a range of 10 Hertz to 1000 Hertz and a temperature of 23 degrees C.

\* \* \* \* \*